(12) United States Patent
Okita et al.

(10) Patent No.: US 7,547,558 B2
(45) Date of Patent: Jun. 16, 2009

(54) METHOD FOR MANUFACTURING SEMICONDUCTOR DEVICE

(75) Inventors: Yoichi Okita, Kawasaki (JP); Junichi Watanabe, Kawasaki (JP); Naoya Sashida, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 330 days.

(21) Appl. No.: 10/835,311

(22) Filed: Apr. 30, 2004

(65) Prior Publication Data

US 2005/0136554 A1    Jun. 23, 2005

(30) Foreign Application Priority Data

Dec. 22, 2003    (JP)    ............... 2003-425786

(51) Int. Cl.
    *H01L 21/00*    (2006.01)
(52) U.S. Cl. ................. 438/3; 257/E21; 257/664
(58) Field of Classification Search .......... 438/3, 438/240, 653, 210, 253, 396, 239; 257/E21.009, 257/E21.664
    See application file for complete search history.

(56) References Cited

U.S. PATENT DOCUMENTS

| | | | |
|---|---|---|---|
| 6,037,003 A * | 3/2000 | Gordon et al. | 427/255.34 |
| 6,225,156 B1 * | 5/2001 | Cuchiaro et al. | 438/240 |
| 6,469,333 B1 * | 10/2002 | Takai et al. | 257/295 |
| 6,673,672 B2 | 1/2004 | Sashida | |
| 6,740,531 B2 * | 5/2004 | Cho et al. | 438/3 |
| 6,809,360 B2 * | 10/2004 | Kato | 257/295 |
| 6,839,220 B1 * | 1/2005 | Hilliger et al. | 361/311 |
| 2001/0044205 A1 * | 11/2001 | Gilbert et al. | 438/653 |
| 2002/0021514 A1 * | 2/2002 | Bui et al. | 360/27 |
| 2002/0127867 A1 * | 9/2002 | Lee | 438/694 |

(Continued)

FOREIGN PATENT DOCUMENTS

JP    2001126221 A  *  5/2001

(Continued)

OTHER PUBLICATIONS

Patent Abstracts of Japan, Publication No. 2002100742, dated Apr. 5, 2002.

(Continued)

*Primary Examiner*—Marcos D. Pizarro
*Assistant Examiner*—Igwe U. Anya
(74) *Attorney, Agent, or Firm*—Westerman, Hattori, Daniels & Adrian, LLP.

(57) ABSTRACT

An $Al_2O_3$ film for covering a ferroelectric capacitor is formed by a sputtering process. The thickness of the $Al_2O_3$ film is preferably optimized according to amount of remanent polarization and fatigue tolerance required for the ferroelectric capacitor, for example, 10 nm to 100 nm. Next, oxygen is supplied to a PZT film via the $Al_2O_3$ film by executing a heat treatment in an oxygen atmosphere. As a result, an oxygen deficit in the PZT film is made up for. At this time, evaporation of Pb in the PZT film is suppressed because of the $Al_2O_3$ film, and deterioration of the fatigue tolerance responsive to decrease of Pb amount is suppressed. Subsequently, another $Al_2O_3$ film is formed as a second protective film by the sputtering process for opposing the deterioration factor in later process. The thickness of the $Al_2O_3$ film is preferably the thickness which sufficiently protects the ferroelectric capacitor from the deterioration factor in later wiring process.

20 Claims, 22 Drawing Sheets

U.S. PATENT DOCUMENTS

| | | | |
|---|---|---|---|
| 2003/0089954 A1* | 5/2003 | Sashida | 257/369 |
| 2003/0141527 A1* | 7/2003 | Joo et al. | 257/295 |
| 2003/0211685 A1* | 11/2003 | Ohyagi | 438/240 |
| 2004/0005724 A1* | 1/2004 | Lee et al. | 438/3 |
| 2004/0043517 A1* | 3/2004 | Sashida | 438/3 |
| 2004/0089894 A1 | 5/2004 | Sashida | |
| 2004/0105213 A1* | 6/2004 | Egger et al. | 361/311 |
| 2004/0141390 A1* | 7/2004 | Won et al. | 365/200 |
| 2004/0183116 A1* | 9/2004 | Cho et al. | 257/303 |
| 2005/0002266 A1* | 1/2005 | Kanaya et al. | 365/232 |
| 2005/0205906 A1* | 9/2005 | Udayakumar et al. | 257/295 |

FOREIGN PATENT DOCUMENTS

| | | |
|---|---|---|
| KR | 2003-0076216 | 9/2003 |

OTHER PUBLICATIONS

Korean Office Action with English translation.

* cited by examiner

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2003-425786, filed on Dec. 22, 2003, the entire contents of which are incorporated herein by reference.

BACKGROUND OF THE INVENTION

1. Field of the Invention

The present invention relates to a method for manufacturing a semiconductor device suitable for a ferroelectric memory.

2. Description of the Related Art

In the process of forming a ferroelectric capacitor used for a ferroelectric memory and the like, an anneal is required for recovering damages of a ferroelectric film.

FIG. 10A to FIG. 10C are sectional views showing a first example (a first prior art) of the conventional method for manufacturing a semiconductor device having a ferroelectric capacitor in order of processes. In the first prior art, as shown in FIG. 10A, a ferroelectric capacitor composing of a lower electrode 103, a PZT film 104, and an upper electrode 105 are formed on an interlayer insulating film 101 by patterning and the like.

Next, an anneal for recovering the capacitor is conducted in an oxygen atmosphere. In this anneal, as shown in FIG. 10B, since an oxygen deficit in the PZT film 104 is made up for by oxygen supplied from an exposed part (a side part) of the PZT film 104, a characteristic of the capacitor is recovered. However, at the same time of this process, Pb in the PZT film 104 is diffused outside and evaporated, so that the characteristic of the capacitor deteriorates.

Subsequently, as shown in FIG. 10C, an alumina protective film 106 is formed for preventing the deterioration caused by infiltration of hydrogen and/or moisture in a subsequent wiring process (a process for forming wiring), further, an interlayer insulating film 102 and a wiring (not shown) and the like are formed.

In the semiconductor device thus fabricated, the portion of which characteristic deteriorates with the decrease of Pb in the PZT film 104 remains as it is. Therefore, the sufficient characteristic can not be obtained.

On one hand, a method for forming a comparatively thin capacitor protective film after the ferroelectric capacitor is formed is introduced. FIG. 11A to FIG. 11C are sectional views showing a second example (a second prior art) of the conventional method for manufacturing a semiconductor device having a ferroelectric capacitor in order of processes. In the second prior art, as shown in FIG. 11A, a ferroelectric capacitor composing of a lower electrode 103, a PZT film 104 and an upper electrode 105 are formed on an interlayer insulating film 101 by patterning and the like, after that, a comparatively thin alumina protective film 106 is formed.

Next, an anneal for recovering the capacitor is conducted in an oxygen atmosphere. As shown in FIG. 11B, since an oxygen deficit in the PZT film 104 is made up for by oxygen supplied from an exposed part (a side surface) of the PZT film 104, a characteristic of the capacitor is recovered. Differently from the first prior art, the diffusion of Pb to outside does not occur.

Subsequently, as shown in FIG. 11C, an interlayer insulation film 102 and a wiring (not shown) and the like are formed. In the second prior art, however, on occasion of forming the interlayer insulation film 102, or on occasion of forming other interlayer insulation films, or on the other occasions and the like, hydrogen and/or moisture are infiltrated into the PZT film 104 through the alumina protective film 106, so that the sufficient characteristic can not be obtained. That is why the thickness of the alumina protective film 106 is insufficient.

On the other hand, a method for forming a thick capacitor protective film after the ferroelectric capacitor is formed is adoptable. FIG. 12A to FIG. 12C are sectional views showing a third example (a third prior art) of the conventional method for manufacturing a semiconductor device having a ferroelectric capacitor in order of processes. In the third prior art, as shown in FIG. 12A, a ferroelectric capacitor composing of a lower electrode 103, a PZT film 104 and an upper electrode 105 are formed on an interlayer insulating film 101 by pattering and the like, after that, an alumina protective film 106 whereof thickness is sufficient for protecting the capacitor is formed.

After that, an anneal for recovering the capacitor in an oxygen atmosphere. In this anneal, as shown in FIG. 12B, differently from the first prior art, a diffusion of Pb to outside does not occur. However, the supply of oxygen from an exposed part (a side surface) of the PZT film is also interrupted, as a result, an oxygen deficit is not made up for.

Subsequently, as shown in FIG. 12C, an interlayer insulating film 102 is formed, further, a wiring (not shown) and the like are formed.

In the semiconductor device thus fabricated, the oxygen deficit in the PZT film 104 remains as it is. Therefore, the sufficient characteristic can not be obtained.

The protective film such as an alumina film covering a ferroelectric capacitor is deposited in such processes as the deterioration of the ferroelectric film is small. The deterioration is caused by hydrogen and/or moisture reducing the ferroelectric film in a deposition environment. Especially, in CVD method in which a wafer often suffered from heat, the deterioration of the ferroelectric film is conspicuous.

As for the processes for depositing the alumina film as the protective film without deteriorating the ferroelectric film, a sputtering process using an alumina target in an atmosphere of Ar gas, and a reactive sputtering process using an aluminum target in an atmosphere including oxygen can be cited. In these processes, since a reducing environment does not exist, the protective film can be deposited without deteriorating the ferroelectric film.

However, as a microfabrication art is progressed, a side wall of the capacitor becomes steep, so that a sufficient coverage can not be obtained by the sputtering process. In order to obtain the sufficient coverage, employing the CVD method is required. However, in the case of employing the CVD method as described above, the ferroelectric film is easy to deteriorate.

Meanwhile, a method for depositing the alumina film employing an ALD (Atomic layer deposition) method is described in a patent document (Japanese Patent Application Laid-open No. 2002-100742). In this method, an atomic layer deposition alumina is mainly used as the protective film. In general, when forming the atomic layer deposition alumina, a good deal of moisture exists in the deposition atmosphere, so that the moisture is easy to be absorbed in the depositing process. Thus, the moisture makes the ferroelectric film deteriorate by the sequential heat treatment or the like. In short, in ALD method, water is often used as an oxidant of TMA (tri-methyl-aluminum) as a material. Since this moisture becomes a source of generating hydrogen, the ferroelectric film deteriorates. In the method described in the patent document, after a very thin first protective film (1 nm to 1.5 nm) is deposited, an anneal is performed in order to remove the moisture absorbed into a ferroelectric film on forming the first protective film. Then, a second protective film opposed to the deterioration factor in the sequential wiring process is formed comparatively thick.

However, in the way described in the patent document, since the first protective film is extremely thin, oxygen can be supplied to the PZT film by the heat treatment but evaporation of Pb in the PZT film can not be suppressed sufficiently.

Furthermore, in a conventional method, after the ferroelectric capacitor is formed, the interlayer insulating film 102 made of Si is formed. Then a W-plug for a bulk contact is formed, further, an insulating film into which nitrogen is mixed is formed for preventing a oxidation of the W-plug, after that, a contact hole reaching to an upper electrode and a contact hole reaching to a lower electrode are formed. And a heat treatment at 500° C. or higher is conducted for recovering damage (process deterioration) of the capacitor with oxygen supplied from the contact holes.

However, in the conventional method, the efficiency of recovery obtained by the anneal is not sufficient.

Besides, after an alumina protective film is formed, an interlayer insulating film and a wiring and so on are formed. When the interlayer insulating film is formed, damages often arise. FIG. 13A to FIG. 13J are sectional views of a conventional method for manufacturing a semiconductor device having a ferroelectric capacitor, showing mainly a method for forming an interlayer insulating film in order of processes.

First, after a field effect transistor is formed on a semiconductor substrate, an interlayer insulating film 101 is formed as shown in FIG. 13A.

Next, as shown in FIG. 13B, a lower electrode film 103 and the PZT film 104 are formed sequentially on the interlayer insulating film 101. Then a crystallization anneal is performed to the PZT film 104. After that, an upper electrode film 105 is formed on the PZT film 104.

Subsequently, as shown in FIG. 13C, by patterning the upper electrode film 105 with an etching process employed, an upper electrode is formed. Next, oxygen anneal for recovering damages caused by the patterning with the etching process employed is performed. Further, by patterning the PZT film 4, a capacity insulating film is formed. An $Al_2O_3$ film 151 is formed, as a protective film, on the whole surface by a sputtering process. Next, by patterning the $Al_2O_3$ film 151 and the lower electrode film 103, a lower electrode is formed. After that, an $Al_2O_3$ film 152 is formed, as a protective film, on the whole surface by the sputtering process.

Next, as shown in FIG. 13D, an interlayer insulating film 154 is formed on the whole surface, and a planarization of the interlayer insulating film 154 is conducted by a CMP (Chemical Mechanical Polishing) method. The thickness of the interlayer insulating film 154 is approximately 1.5 µm.

Subsequently, as shown in FIG. 13E, a hole reaching to a high concentration diffused layer (not shown) of the transistor is formed through the interlayer insulating film 154 and the like. After that, by forming a Ti film and a TiN film sequentially in the hole, a barrier metal film (not shown) is formed. Further, a W-film is embedded in the hole employing a CVD (Chemical Vapor Deposition) method. And by executing the planarization of the W-film employing the CMP method, a W-plug 155 is formed.

Next, as shown in FIG. 13F, a SiON film 156 is formed for preventing the oxidation of the W-plug.

Next, as shown in FIG. 13G, a hole reaching to the upper electrode film 105 and a hole reaching to the lower electrode film 103 are formed through the SiON film 156 and the like.

After that, as shown in FIG. 13H, the oxygen anneal is performed for recovering damages. In this oxygen anneal, oxygen reaches to the PZT film 104 via the upper electrode 105, at the same time, oxygen reaches there via the interlayer insulating film 154, the $Al_2O_3$ films 152 and 151 from the neighborhood of interface between the upper electrode film 105 and the PZT film 104.

Subsequently, as shown in FIG. 13I, the SiON film 156 is removed through the whole surface by an etch-back process, so that the surface of the W-plug 155 is exposed.

Next, as shown in FIG. 13J, under the condition that a part of the surface of the upper electrode film 105, a part of the surface of the lower electrode film 103 and the surface of the W-plug 155 are exposed, an Al film is formed. By patterning the Al film, an Al wiring 157 is formed.

Furthermore, an interlayer insulating film, a contact plug, wirings under the second layer from the bottom and the like are formed. Then, a cover film composing of, for example, a TEOS oxidized film and a SiN film is formed to complete a ferroelectric memory having the ferroelectric capacitor.

However, when the semiconductor device is fabricated in the way described above, hydrogen and/or moisture easily reaches to the PZt film 104 on forming the interlayer insulating film 154, as a result, a characteristic deteriorates.

SUMMARY OF THE INVENTION

An object of the present invention is to provide a method for manufacturing a semiconductor device which is capable of recovering a deterioration of a ferroelectric film with high efficiency.

After diligent efforts to seek for solutions to the above problem, the present inventors have come to the following some embodiments of the invention.

In a first method for manufacturing a semiconductor according to the present invention, after a lower electrode film, a ferroelectric film and an upper electrode film are formed, the upper electrode film, the ferroelectric film and the lower electric film are patterned respectively. Next, a first protective film covering the upper electrode film, the ferroelectric film and the lower electrode film is formed. Subsequently, by performing an anneal in an atmosphere containing oxygen, oxygen is supplied to the ferroelectric film via the first protective film. After that, a second protective film covering the first protective film is formed. In the first method for manufacturing the semiconductor device, the first protective film has the thickness which is set to such a degree that configuration elements of the ferroelectric film do not substantially penetrate through the first protective film, and that oxygen penetrates through the film. And the second protective film has the thickness which is set to such a degree that hydrogen and moisture do not substantially penetrate through the second protective film.

In a second method for manufacturing a semiconductor device according to the present invention, after a lower electrode film, a ferroelectric film and an upper electrode film are formed, the upper electrode film, the ferroelectric film and the lower electric film are patterned respectively. Next, a third protective film covering the upper electrode film, the ferroelectric film and the lower electrode film is formed. Subsequently, a first interlayer insulating film is formed above the third protective film. After that, by performing an anneal in an atmosphere containing oxygen, oxygen is supplied to the ferroelectric film via the third protective film. Then, a second interlayer insulating film is formed above the first interlayer insulating film.

DETAILED DESCRIPTION OF THE PREFERRED EMBODIMENTS

Figure 2A:
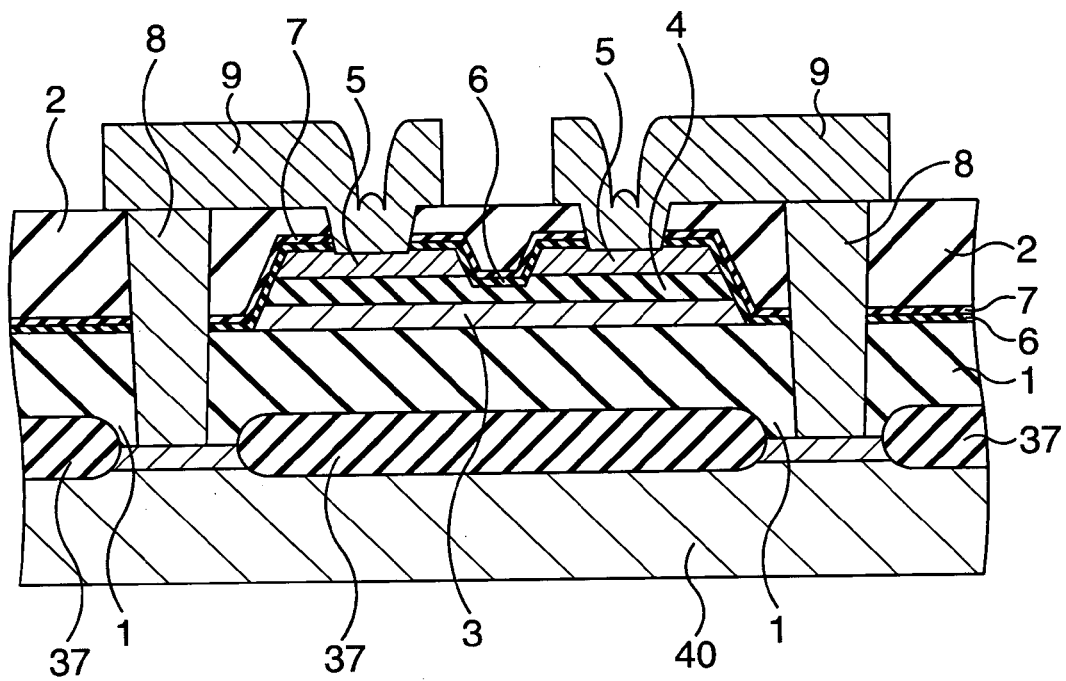
FIG. 2A and FIG. 2B are sectional views showing a configuration of a memory cell of the ferroelectric memory.
Figure 2B:
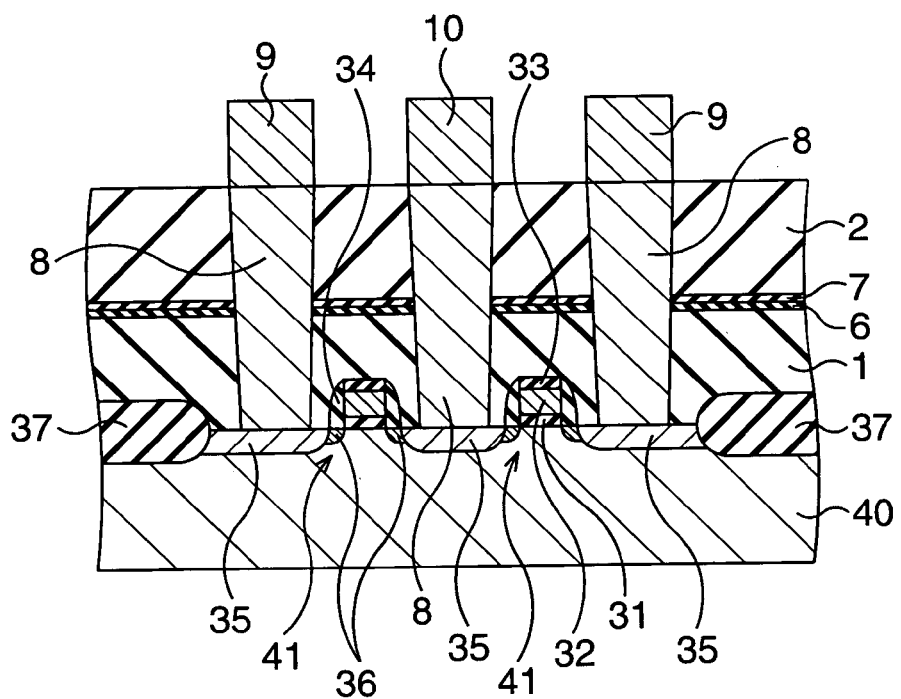
Figure 3:
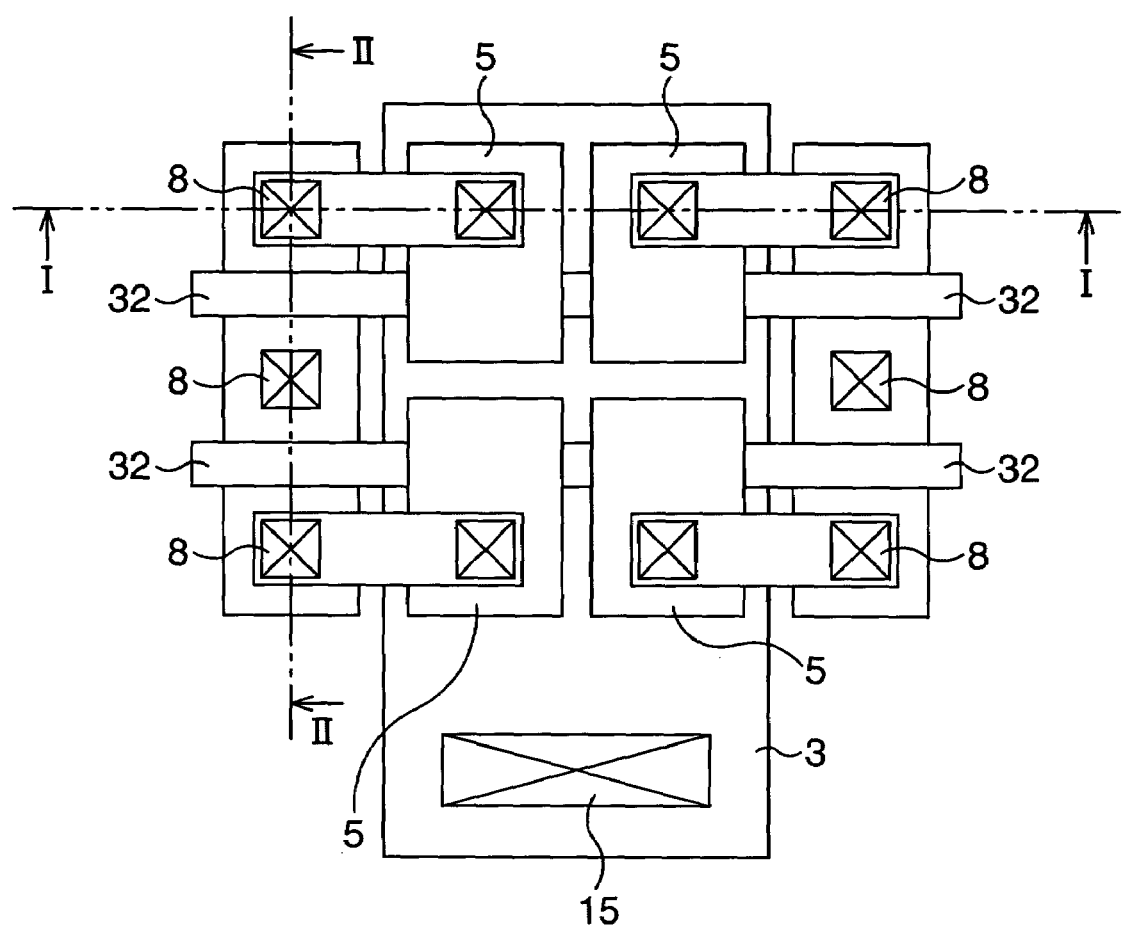
FIG. 3 is a layout illustrating a relation between electrodes.

Hereinafter, some embodiments of the present invention will specifically described with reference to the accompanying drawings. FIG. 1A to FIG. 1F are sectional views showing a method for manufacturing a ferroelectric memory (a semiconductor device) having a ferroelectric capacitor according to a first embodiment of the present invention. FIG. 2A and FIG. 2B are sectional views showing a configuration of a memory cell of the ferroelectric memory. FIG. 3 is a layout illustrating a relation between electrodes. FIG. 2A and FIG. 2B are sectional views taken along the I-I line, II-II line in FIG. 3 respectively.

In the present embodiment, as a memory cell, a ferroelectric memory in which planar 1T1C (1 transistor-1 capacitor)-type ferroelectric memory cells are arranged in an array is fabricated. In the following description, a direction in which a word line extends is called a row direction, and a direction orthogonal to a word line is called a column direction.

First, a field effect transistor 41 (refer to FIG. 2B) is formed on the surface of a semiconductor substrate 40 (refer to FIG. 2A and FIG. 2B) as a switching element of each memory cell. Next, an interlayer insulating film (a base film) 1 for covering each transistor 41 is formed.

Figure 1A:
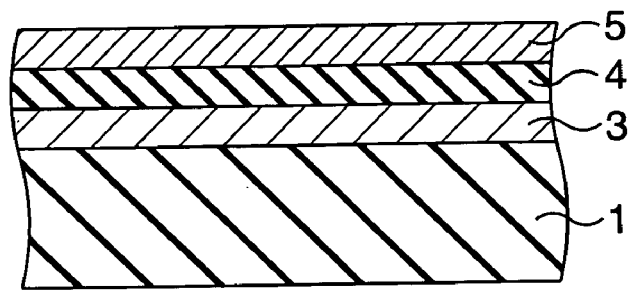
FIG. 1A to FIG. 1F are sectional views showing a method for manufacturing a ferroelectric memory having a ferroelectric capacitor according to a first embodiment of the present invention.
Figure 1B:
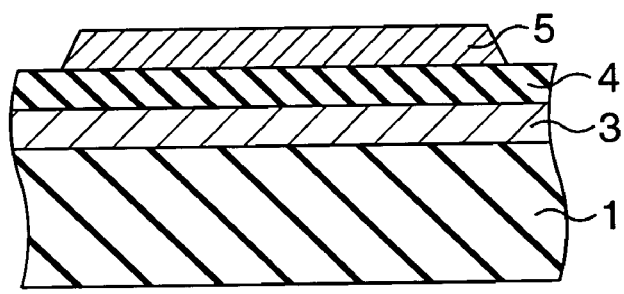
Figure 1C:
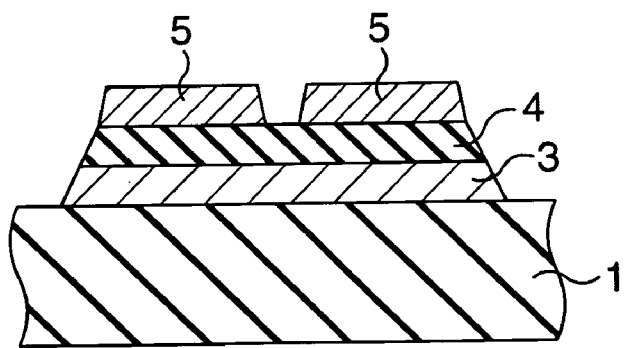

Subsequently, as shown in FIG. 1A, a lower electrode film 3, PZT [Pb (Zr, Ti) $O_3$] film 4 (a ferroelectric film) and an upper electrode film 5 are formed sequentially on the interlayer insulating film 1. The thickness of the lower electrode film 3, the PZT film 4 and the upper electrode film 5 are, for example, 150 nm, 200 nm, 250 nm, respectively. Next, as shown in FIG. 1B, the upper electrode film 5 is processed to be a planar shape of an upper electrode by patterning. Further, as shown in FIG. 1C, the PZT film 4 and the lower electrode film 3 are processed sequentially to be the planar shapes of a capacity insulating film and a lower electrode by patterning, respectively.

Accordingly, an ferroelectric capacitor, having the upper electrode consisting of the upper electrode film 5 made of $IrO_2$ film or the like, the capacity insulating film consisting of the PZT film 4, and the lower electrode consisting of the lower electrode film 3 made of Pt film or the like, is formed. The lower electrode functions also as a plate line described later.

Figure 1D:
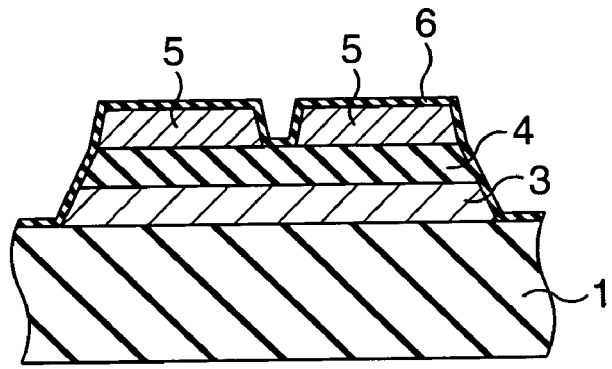

After that, as shown in FIG. 1D, an $Al_2O_3$ film 6 for covering the ferroelectric capacitor is formed as a first protective film by a sputtering process. The thickness of the $Al_2O_3$ film 6 is preferably optimized according to amount of remanent polarization and fatigue tolerance required for the ferroelectric capacitor, for example, 10 nm to 100 nm. The $Al_2O_3$ film 6 may be a CVD alumina film deposited by an ALD method which uses TMA (tri-methyl-aluminum) as a deposition gas, and uses the gas not including hydrogen such as ozone or NO as an oxidant, or it may be a CVD alumina film deposited by a plasma CVD method which uses aluminum tri-sec-butoxide [Al (O-sec-$C_4H_9$)$_3$] or aluminum tri-isopropoxide [Al (O-i-$C_3H_7$)$_3$] as the deposition gas, and uses a material including oxygen as the oxidant, or other alumina films are also available. In short, the $Al_2O_3$ film 6 is preferably formed under the condition not deteriorating the PZT film 4.

Figure 1E:
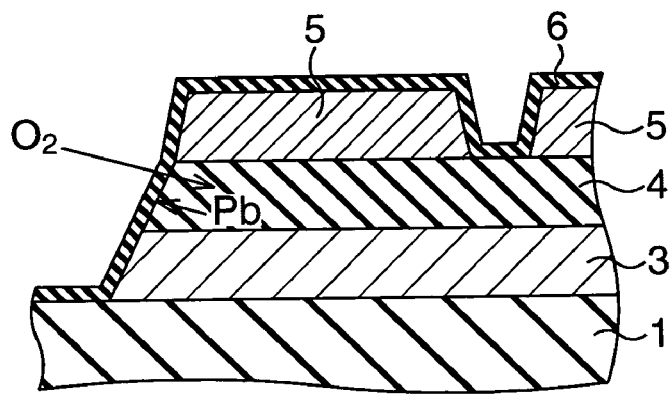

Subsequently, a heat treatment is conducted in an oxygen atmosphere so as to supply oxygen to the PZT film 4 through the $Al_2O_3$ film 6. As a result, an oxygen deficit is made up for in the PZT film 4. The temperature of the heat treatment may be, for example, 550° C. to 750° C., more preferably, 600° C. to 750° C. On this treatment, evaporation of Pb in the PZT film 4 is restrained because of the $Al_2O_3$ film 6, as shown in FIG. 1E, so that deterioration of the fatigue tolerance responsive to decrease of Pb amount is suppressed.

Figure 1F:
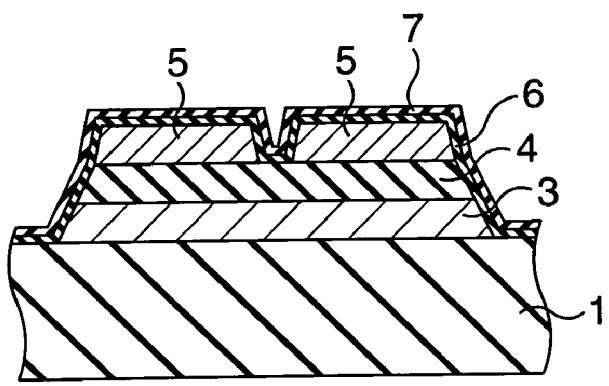

Next, as shown in FIG. 1F, an $Al_2O_3$ film 7 is formed as a second protective film by a sputtering process as a second protective film for opposing a deterioration factor in later process. The thickness of the $Al_2O_3$ film 7 is preferably the thickness which sufficiently protects the ferroelectric capacitor from the deterioration factor in later wiring process, for example, more than 20 nm. The $Al_2O_3$ film 7 may be a CVD alumina film deposited by the ALD method which uses TMA as the deposition gas, and uses the gas not including hydrogen such as ozone or NO as the oxidant, or it may be a CVD alumina film deposited by the plasma CDV method which uses aluminum tri-sec-butoxide [Al (O-sec-$C_4H_9$)$_3$] or aluminum tri-isopropoxide [Al (O-i-$C_3H_7$)$_3$] as the deposition gas, and uses oxygen as the oxidant, or other alumina films are also available. In short, the $Al_2O_3$ film 7 is preferably formed under the condition not deteriorating the PZT film 4.

Next, as shown in FIG. 2A and FIG. 2B, an interlayer insulating film 2 is formed on the whole surface. Note that a layered stack consisting of the $Al_2O_3$ films 6 and 7 corresponds to a third protective film 3 in the third embodiment.

After that, a contact hole reaching to a high-concentration source/drain diffused layer 35 of the field effect transistor 41 is formed through the interlayer insulating film 2, the $Al_2O_3$ films 6 and 7, and the interlayer insulating film 1. A contact plug 8 is embedded in the contact hole. Besides, a contact hole for wiring reaching to the upper electrode film 5 is formed through the interlayer insulating film 2 and the $Al_2O_3$ films 6 and 7. A wiring 9 connected to the upper electrode film 5 via these contact holes, and connected to the contact plug 8 are formed, and a bit wiring 10 is formed.

Furthermore, as shown in FIG. 3, a contact hole for the plate line reaching to the lower electrode film 3 is formed through the interlayer insulating film 2 and so forth. A contact plug 15 is embedded in the contact hole, a wiring connected to a constant voltage source which supplies constant voltage to the plate line (the lower electrode film 3) is formed on the upper layer of the contact hole, so as to connect the wiring to the contact plug 15.

Lastly, the protective film and the like are formed to complete the ferroelectric memory.

It should be noted that the field effect transistor 41 formed on the surface of the semiconductor substrate 40 is equipped with a gate insulating film 31, a gate electrode 32, a cap film 33, a side wall insulating film 34, the high-concentration source/drain diffused layer 35 and a low-concentration source/drain diffused layer 36 as shown in FIG. 2A and FIG. 2B. An element active region in which the field effect transistor is formed is divided by an element isolation insulating film 37.

Figure 4:
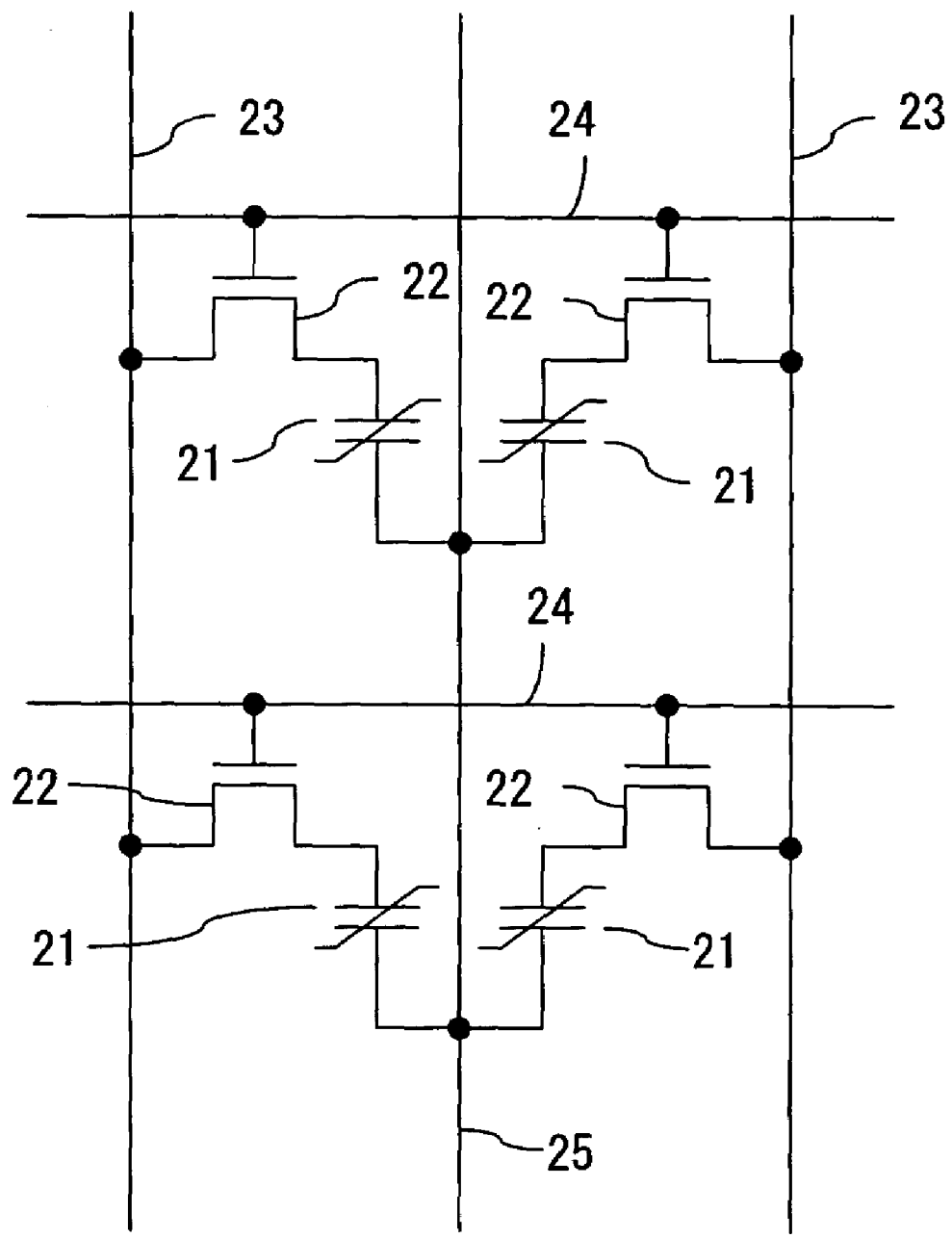
FIG. 4 is an equivalent circuit view showing a configuration of the ferroelectric memory.

FIG. 4 is an equivalent circuit view showing a configuration of the ferroelectric memory fabricated as described above. A ferroelectric capacitor 21 in FIG. 4 corresponds to the ferroelectric capacitor having the lower electrode film 3, the PZT film 4, and the upper electrode film 5. A MOS transistor 22 corresponds to the field effect transistor 41. A bit line 23 corresponds to the bit wiring 10. A word line 24 corresponds to the gate electrode 32. And a plate line 25 corresponds to the lower electrode film 3.

In a memory cell array of the ferroelectric memory thus configured, data is stored according to a polarization state of the ferroelectric film (PZT film 4) equipped in the ferroelectric capacitor 21.

According to the first embodiment described above, the thickness of $Al_2O_3$ film 6 (the first protective film) is set to such a degree that oxygen penetrates sufficiently through the film and the oxygen deficit can be made up for, by the later heat treatment in oxygen atmosphere, as well as to such a degree that the evaporation of Pb in the PZT film 4 can be sufficiently suppressed. As a result, the fatigue deterioration can be suppressed while securing the high amount of remanent polarization.

Hereinafter, a result of an experiment related to the amount of remanent polarization and the fatigue characteristic actually made by the present inventors will be explained. First, a ferroelectric capacitor having a lower electrode made of Pt, a capacity insulating film made of PZT and an upper electrode made of $IrO_2$ was fabricated. Next, $Al_2O_3$ films (alumina films) having various thickness (20 nm, 50 nm, 100 nm) were deposited by the sputtering process. Then, an anneal (an anneal for recovering the capacitor) at 650° C. in the oxygen atmosphere was conducted for one hour, so that the oxygen deficit of the PZT film was made up for. After that, an opening reaching to the upper electrode and an opening reaching to the lower electrode were formed. Then, measurements of amount of remanent polarization 2 Pr and deterioration amount of polarization of each specimen were conducted.

Figure 5:
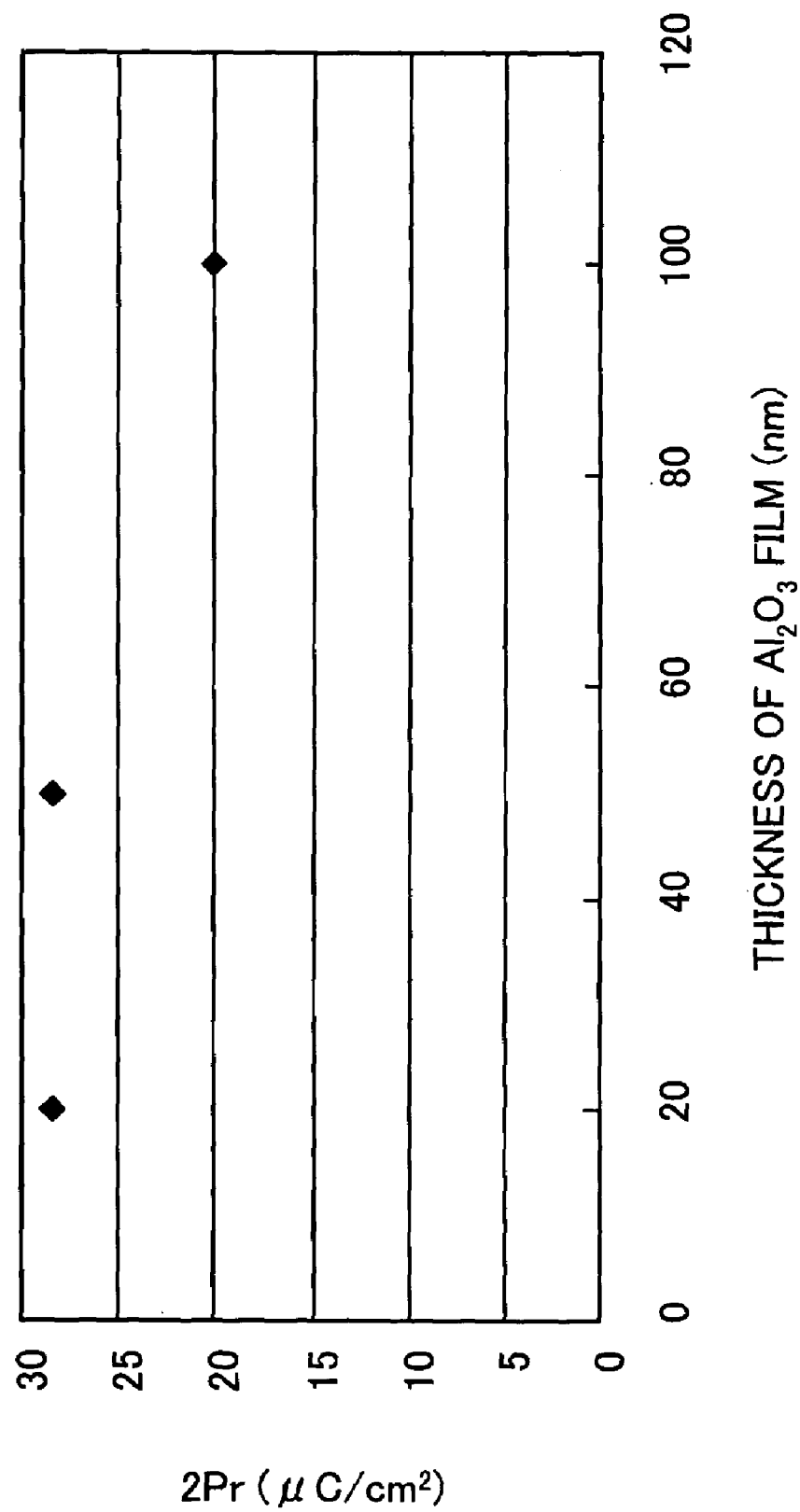
FIG. 5 is a graph showing a relation between a thickness of an $Al_2O_3$ film and amount of remanent polarization 2 Pr.

FIG. 5 is a graph showing a relation between the thickness of the $Al_2O_3$ film (the alumina film) and the amount of remanent polarization 2 Pr. As shown in FIG. 5, when the thickness of the $Al_2O_3$ film formed as the protective film was 20 nm or 50 nm, the remanent polarization 2 Pr maintained high amount, however, when the thickness was up to 100 nm, the amount of remanent polarization 2 Pr decreased. The reason is thought that the $Al_2O_3$ film of 100 nm is too thick, penetrating capability of oxygen is lowered on the anneal for recovering the capacitor, and sufficient oxygen is not supplied to the PZT film, so that the oxygen deficit in the PZT film can not sufficiently made up for.

Figure 6:
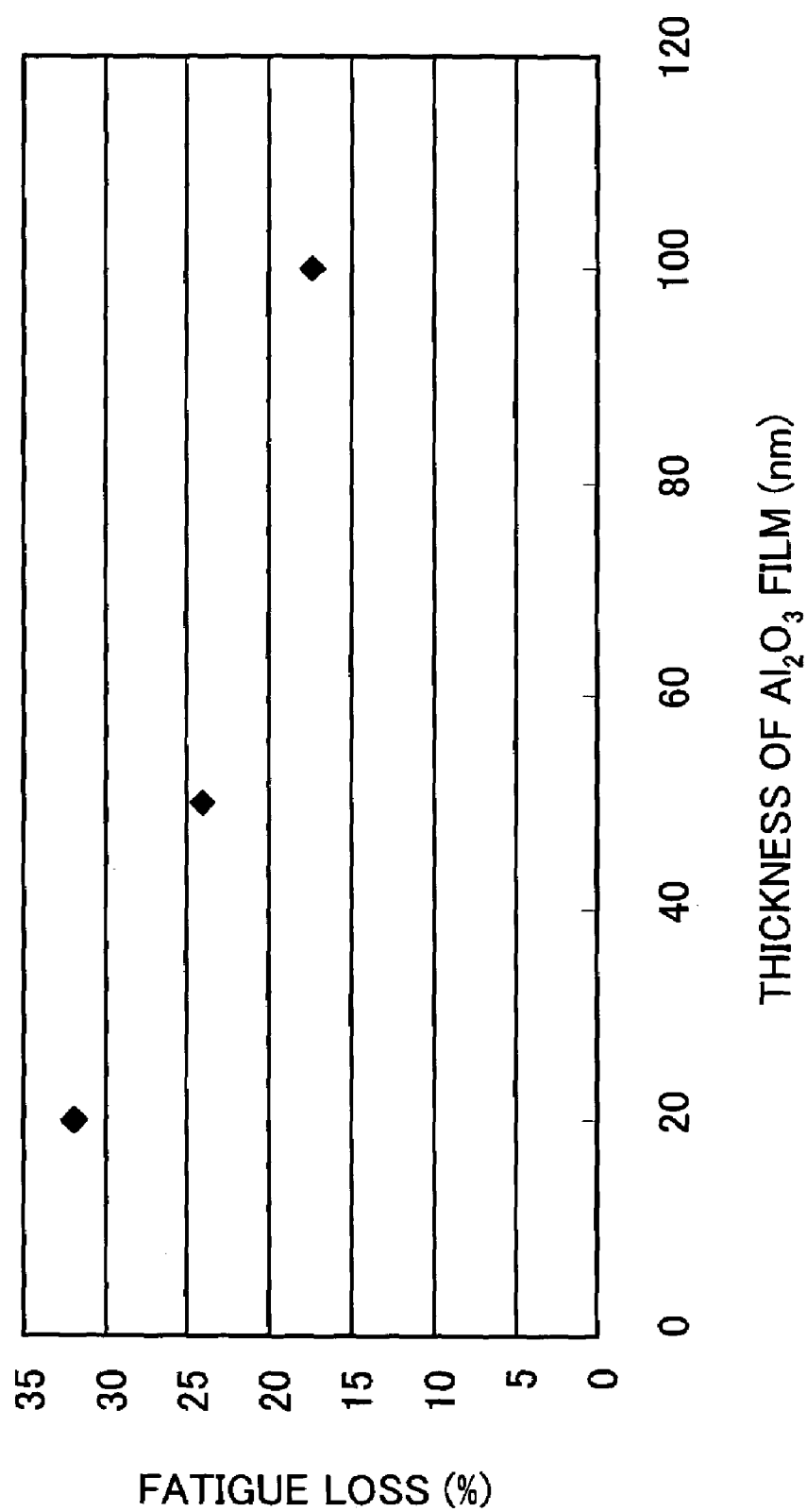
FIG. 6 is a graph showing a relation between a thickness of an $Al_2O_3$ film and deterioration amount of polarization caused by fatigue.

FIG. 6 is a graph showing a relation between the thickness of the $Al_2O_3$ film (the alumina film) and the deterioration amount of polarization caused by fatigue. The deterioration amount of polarization is shown by deteriorated degree of polarization amount (%) after fatigue pulse (7V, 1 μsecond width rectangular pulse, $2 \times 10^9$ cycles) was applied, regarding the polarization amount before the fatigue pulse is applied as reference amount. The ferroelectric capacitor whereof the capacity insulating film is PZT has a tendency that the fatigue deterioration becomes conspicuous when Pb amount in the PZT film decreases. The graph shown in FIG. 6 explains how the fatigue deterioration amounts are changed by Pb amount in the PZT film evaporated through the alumina protective film (the $Al_2O_3$ film) As shown in FIG. 6, the thicker the alumina protective film became, the smaller deterioration amount of polarization (fatigue) became, namely, the alumina protective film suppressed the evaporation of Pb in the PZT film.

As described above, there is trade-off relationship between the penetrating capability of oxygen and evaporation blocking capability of Pb. And the most preferable thickness of an alumina protective film depends on ferroelectric materials used for the film, temperature of recovering anneal and a device structure. The thickness of the alumina protective film should be optimized according to the required amount of remanent polarization and the fatigue deterioration tolerance. However, as shown by these data, the thickness of the alumina protective film is preferably 10 nm to 100 nm.

Besides, in the present embodiment, the thickness of the $Al_2O_3$ film 7 (the second protective film) is set to such a degree that the capacitor is protected sufficiently from the deterioration factor, for example, the diffusion of hydrogen and/or moisture in later wiring process (process for forming wiring), so that the deterioration of ferroelectric capacitor can be prevented, covering insufficiency of protection only by the $Al_2O_3$ film 6. The thickness of the $Al_2O_3$ film 7 is preferably more than 20 nm.

Hereinafter, a manufacturing method for a ferroelectric memory (a semiconductor device) having a ferroelectric capacitor according to a second embodiment of the present invention will be described. FIG. 7A to FIG. 7L are sectional views showing the manufacturing method for the ferroelectric memory (the semiconductor device) according to the second embodiment in order of processes.

Figure 7A:
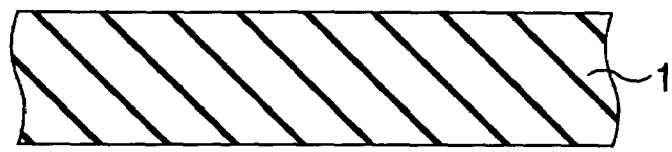
FIG. 7A to FIG. 7L are sectional views showing a method for manufacturing a ferroelectric memory in order of processes according to a second embodiment of the present invention.

First, in the present embodiment, as shown in FIG. 7A, processes from a fabrication of a field effect transistor to a formation of an interlayer insulating film 1 are conducted in the same way as the first embodiment.

Figure 7B:
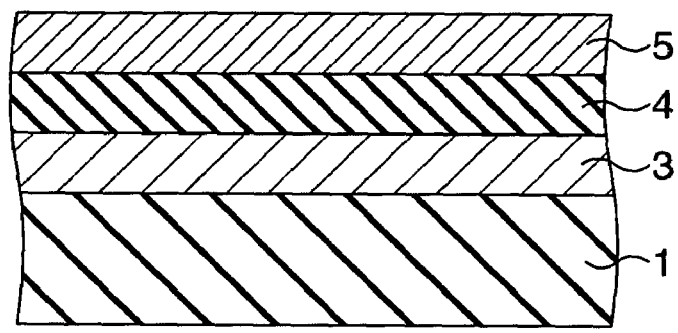

Next, as shown in FIG. 7B, a lower electrode film 3 and a PZT film 4 are formed sequentially on the interlayer insulating film 1. Then a crystallization anneal is performed to the PZT film 4. After that, an upper electrode film 5 is formed on the PZT film 4.

Figure 7C:
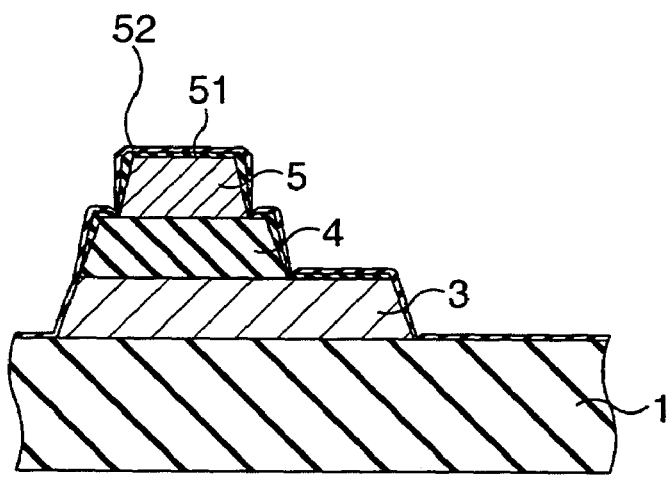

Subsequently, as shown in FIG. 7C, an upper electrode is formed by patterning the upper electrode film 5, employing an etching process. Next, an oxygen anneal is conducted to recover damages caused by the patterning with the etching process being employed. Further, by patterning the PZT film 4, a capacity insulating film is formed. Then the oxygen anneal for preventing the films from peeling off is executed. Next, an $Al_2O_3$ film 51, as a protective film, is formed on the whole surface by a sputtering process. Subsequently, the oxygen anneal is conducted to alleviate damages caused by the sputtering process. Next, by patterning the $Al_2O_3$ film 51 and the lower electrode film 3, a lower electrode is formed. Then the oxygen anneal for preventing the film from peeling off is executed. After that, an $Al_2O_3$ film 52, as a protective film, is formed on the whole surface by the sputtering process. Lastly, the oxygen anneal for decreasing a capacitor leakage is performed. A layered stack consisting of the $Al_2O_3$ films 51 and 52 corresponds to a third protective film in the present embodiment.

Figure 7D:
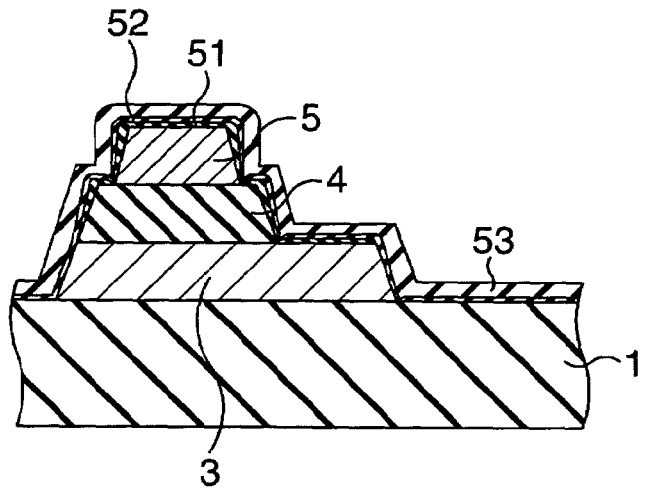

Next, as shown in FIG. 7D, an interlayer insulating film 53 (a first interlayer insulating film) is formed on the whole surface. The interlayer insulating film 53 is, for example, an interlayer insulating film made of Si whereof thickness is, for example, 10 nm to 200 nm. The interlayer insulating film 53 can be formed by a normal-pressure CVD method or a low-pressure CVD method.

Figure 7E:
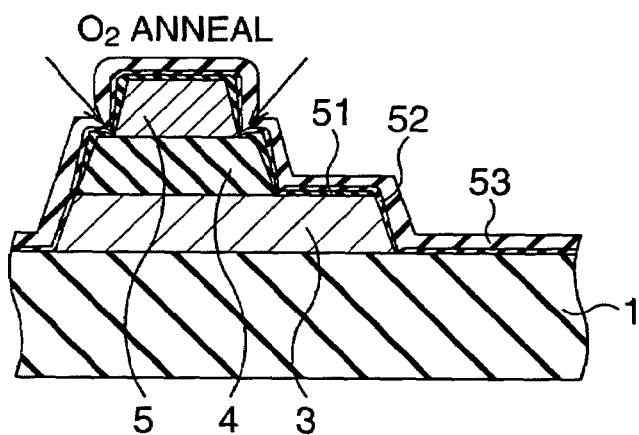

Then, as shown in FIG. 7E, the oxygen anneal at 350° C. and more, for example, is performed so that the damages generated in the PZT film 4 when forming the interlayer insulating film 53 can be recovered. At this time, the side part of the upper electrode of the $Al_2O_3$ films 51 and 52 is thinner than the upper part of the upper electrode of the $Al_2O_3$ films 51 and 52 due to an influence of coverage. At the vicinity of interface between the upper electrode and the capacity insulating film, and the vicinity of interface between the capacity insulating film and the lower electrode, the thickness of the $Al_2O_3$ films 51 and 52 is thinner than the thickness at the other parts. Consequently, oxygen diffused through the interlayer insulating film 53 will diffuse to the PZT film 4 (the capacity insulating film) easily from the vicinity of interface between the upper electrode and the capacity insulating film. Note that this anneal is preferably performed not using plasma.

Figure 7F:
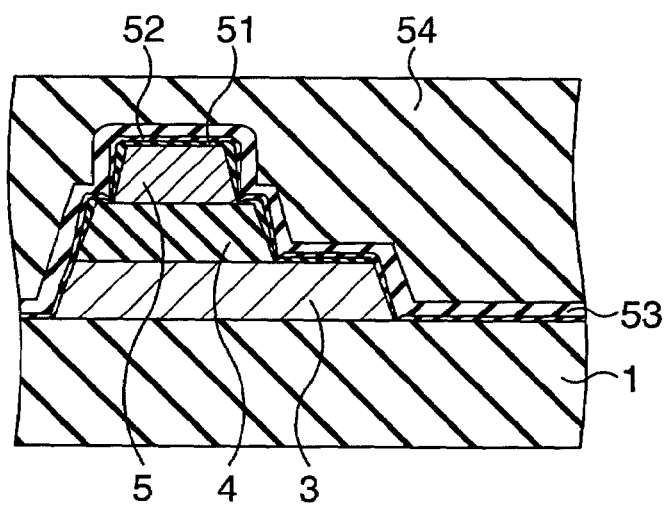

After that, as shown in FIG. 7F, an interlayer insulating film 54 is formed on the whole surface, and a planarization of the interlayer insulating film 54 is conducted by a CMP (Chemical Mechanical Polishing) method. The interlayer insulating film 54 is, for example, the insulating film made of Si whereof thickness is approximately 1300 nm to 1500 nm. The interlayer insulating film 54 can be formed by the normal-pressure CVD method or the low-pressure CVD method.

Figure 7G:
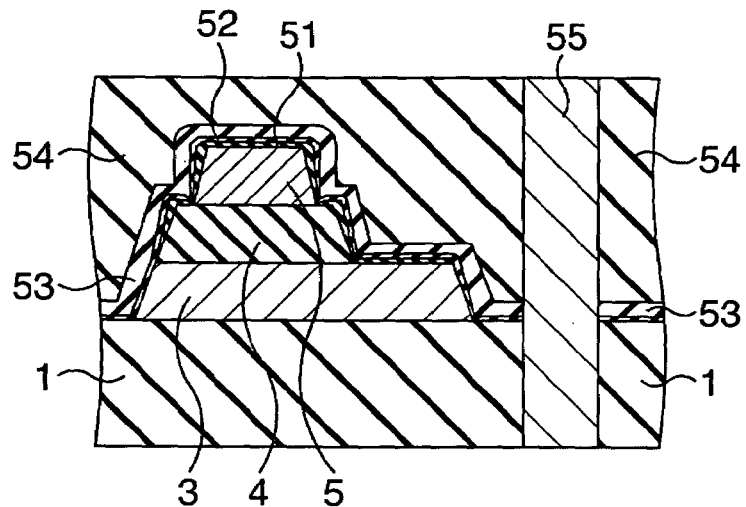

Subsequently, as shown in FIG. 7G, a hole reaching to a high concentration diffused layer (not shown) of the transistor through the interlayer insulating films 54 and 53, the $Al_2O_3$ film 52 and the interlayer insulating film 1. After that, a Ti film and TiN film are formed continuously in the hole by the sputtering process so that a barrier metal film (not shown) is formed. Further, a W-film is embedded in the hole by the CVD (Chemical Vapor Deposition) method, and the planarization of the W-film is executed by the CMP method so that a W-plug 55 is formed.

Figure 7H:
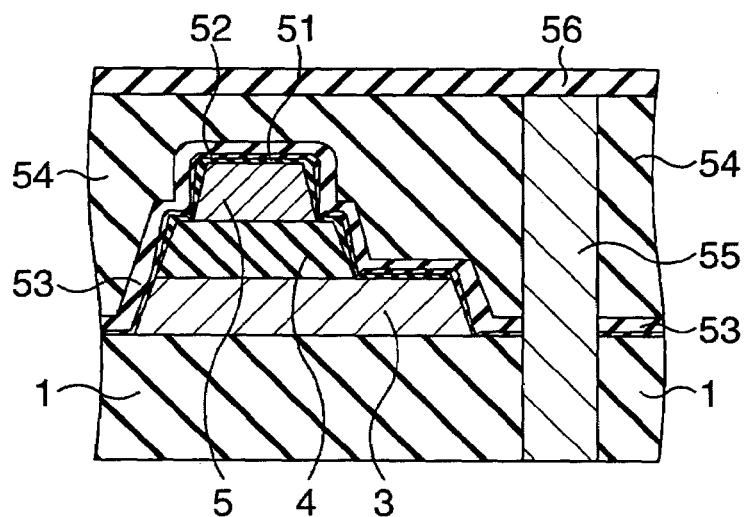

Next, as shown in FIG. 7H, a SiON film 56 is formed for preventing oxidation of the W-plug 55, for example, by a plasma enhanced CVD method.

Figure 7I:
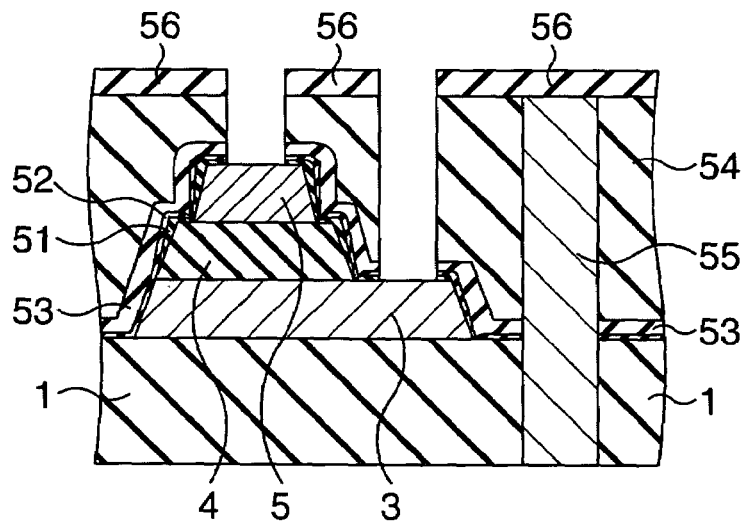

Next, as shown in FIG. 7I, a hole reaching to the upper electrode film 5, and a hole reaching to the lower electrode film 3 are formed through the SiON film 56, the interlayer insulating films 54 and 53, and the $Al_2O_3$ films 52 and 51.

Figure 7J:
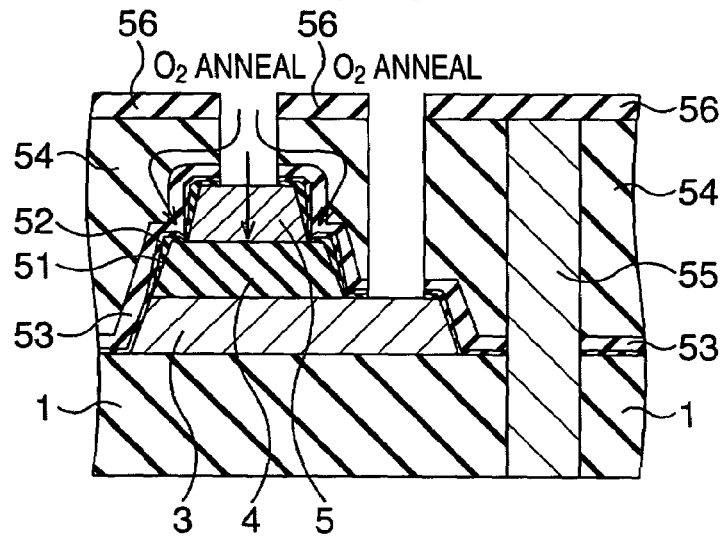

After that, as shown in FIG. 7J, the oxygen anneal for recovering damages is conducted. On this annealing, oxygen reaches to the PZT film via the upper electrode film 5, at the same time, to the PZT film 4 from the vicinity of interface between the upper electrode film 5 and PZT film 4 via the interlayer insulating films 54 and 53, and the $Al_2O_3$ films 52 and 51.

Figure 7K:
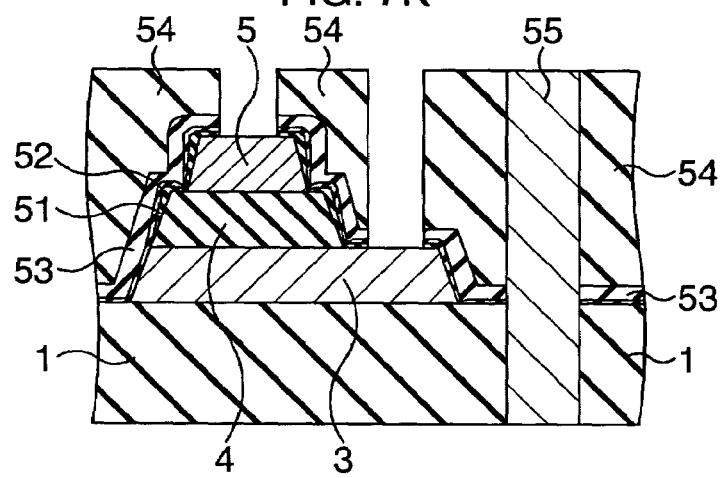

Subsequently, as shown in FIG. 7K, the SiON film 56 is removed through the whole surface by an etch-back process, so that the surface of the W-plug 55 is exposed.

Figure 7L:
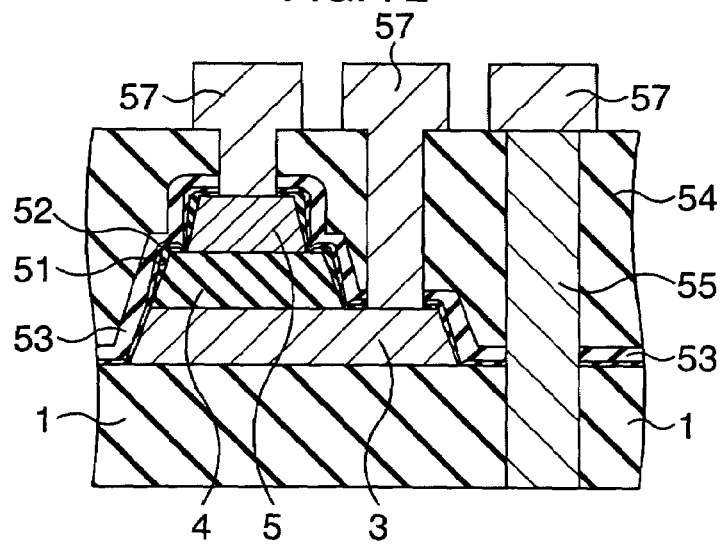

Next, as shown in FIG. 7L, in a state that a part of the surface of the upper electrode film 5, a part of the surface of the lower electrode film 3, and the surface of the W-plug 55 are exposed, an Al film is formed. By patterning the Al film, an Al wiring 57 is formed. At this state, for example, the W-plug 55 and the upper electrode film 5 or the lower electrode film 3 are connected to each other by the Al wiring 57.

Furthermore, an interlayer insulating film, a contact plug, wirings under the second layer from the bottom and the like are formed. Then a cover film composing of, for example, the TEOS oxidized film and SiN film is formed so as to complete the ferroelectric memory having the ferroelectric capacitor.

According to the second embodiment as described above, a good deal of damage is generated on the PZT film 4 on forming the interlayer insulating film 53, however, oxygen is supplied to the PZT film 4 via the vicinity of the interface between the upper electrode film 5 and the PZT film 4 by the oxygen anneal before the formation of the thick interlayer insulating film 54, so that damages such as the oxygen deficit of the PZT film 4 can be recovered easily and surely.

In other words, in the second embodiment, after the comparatively thin interlayer insulating film 53 is formed, the oxygen anneal is conducted before the thick interlayer insulating film 54 is formed, so that damages of PZT film 4 can be recovered with high efficiency. Besides, in the present embodiment, from the standpoint that the thickness of the alumina film is thinner than the other parts, at the vicinity of the interface between the upper electrode and the capacity insulating film, the oxygen deficit can be easily made up for. The reason is that the oxygen diffusion to the PZT film 4 can be made more easily and more efficiently by the supply of oxygen via the thinnish part described above than the supply of oxygen via the upper electrode.

Next, a manufacturing method for a ferroelectric memory having a ferroelectric capacitor according to a third embodiment of the present invention will be described. FIG. 8A to FIG. 8I are sectional views showing the manufacturing method for the ferroelectric memory (the semiconductor device) according to the third embodiment in order of processes.

Figure 8A:
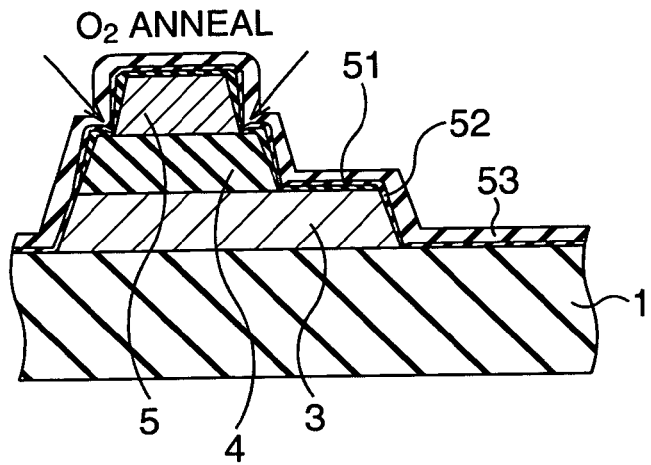
FIG. 8A to FIG. 8I are the sectional views showing a method for manufacturing a ferroelectric memory according to a third embodiment of the present invention in order of processes.

First, in the present embodiment, processes from a fabrication of a field effect transistor to a formation of an interlayer insulating film 53 are conducted in the same way as the second embodiment. After that, as shown in FIG. 8A, an oxygen anneal is performed to recover damages generated in a PZT film 4 on forming the interlayer insulating, film 53.

Figure 8B:
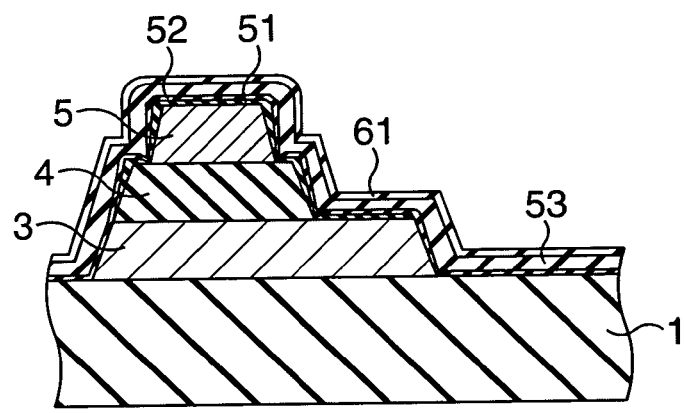

Next, as shown in FIG. 8B, an $Al_2O_3$ film 61 is formed as a fourth protective film on the interlayer insulating film 53.

Figure 8C:
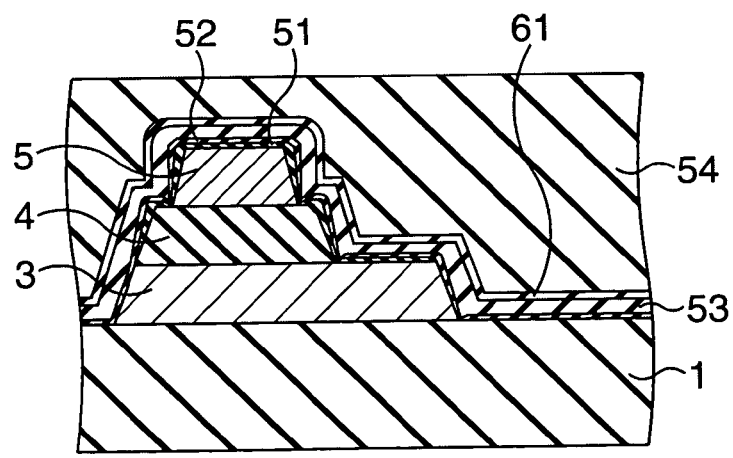

After that, as shown in FIG. 8C, an interlayer insulating film 54 is formed on the whole surface, and a planarization of the interlayer insulating film 54 is conducted by a CMP (Chemical Mechanical Polishing) method.

Figure 8D:
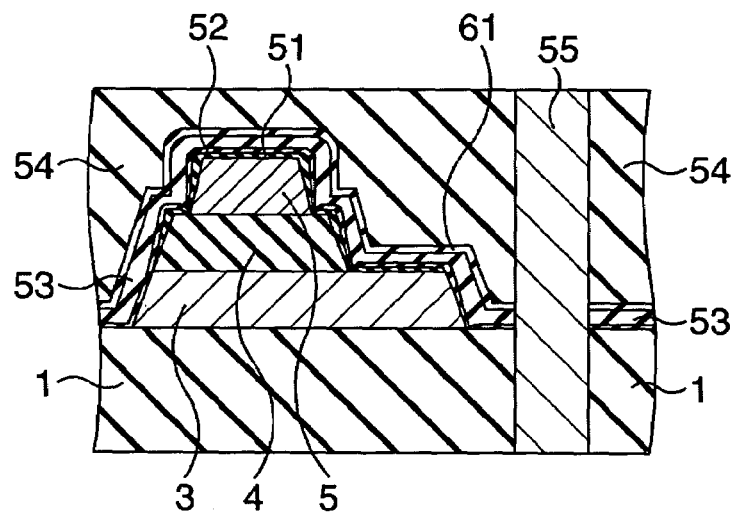

Subsequently, as shown in FIG. 8D, a hole reaching to a high concentration diffused layer of the transistor (not shown) is formed in the same way as the second embodiment, then a W-plug 55 is formed.

Figure 8E:
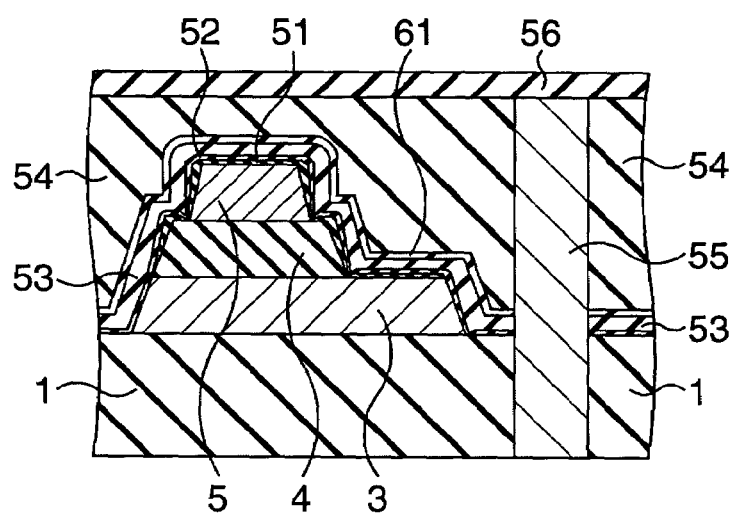

Next, as shown in FIG. 8E, a SiON film 56 is formed for preventing oxidation of the W-plug 55, for example, by a plasma enhanced CVD method.

Figure 8F:
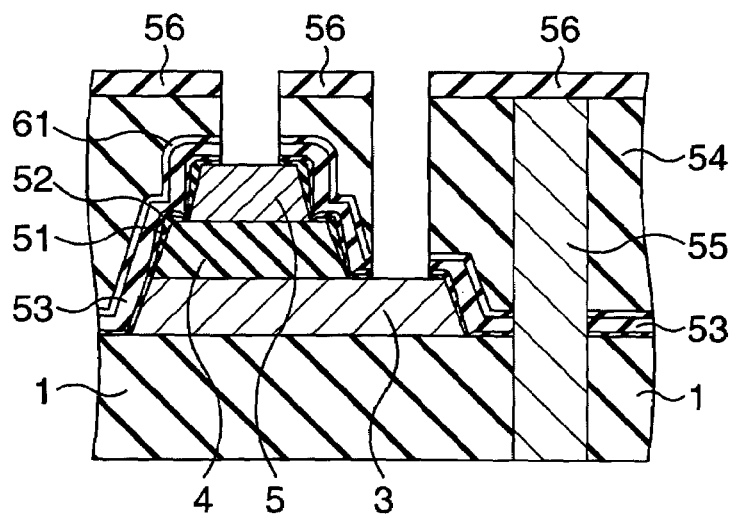

Subsequently, as shown in FIG. 8F, a hole reaching to an upper electrode film 5 and a hole reaching to a lower electrode film 3 are formed.

Figure 8G:
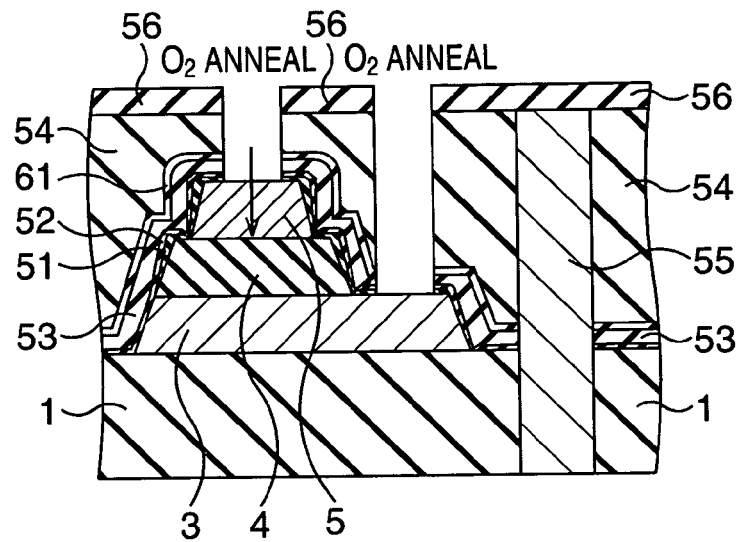

After that, as shown in FIG. 8G, an oxygen anneal for recovering damages is executed. On this oxygen anneal, oxygen reaches to the PZT film 4 via the upper electrode film 5, however, differently from the second embodiment, oxygen is hardly supplied from the vicinity of interface between the upper electrode film 5 and the PZT film 4.

Figure 8H:
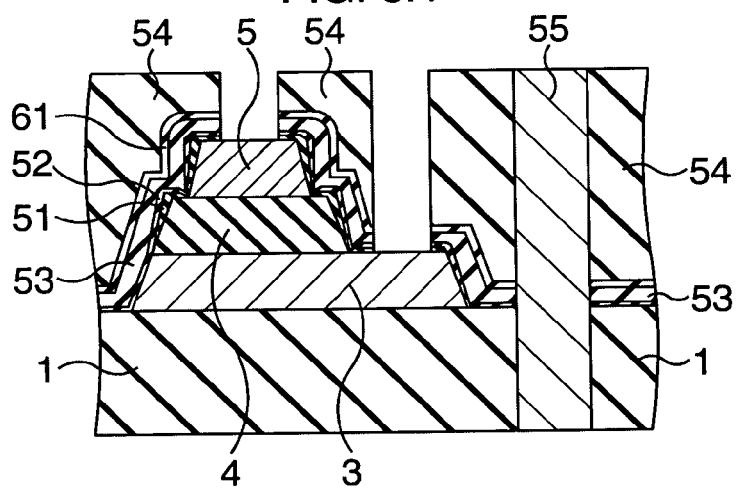

Subsequently, as shown in FIG. 8H, the SiON film 56 is removed through the whole surface by an etch-back process, so that the surface of the W-plug 55 is exposed.

Figure 8I:
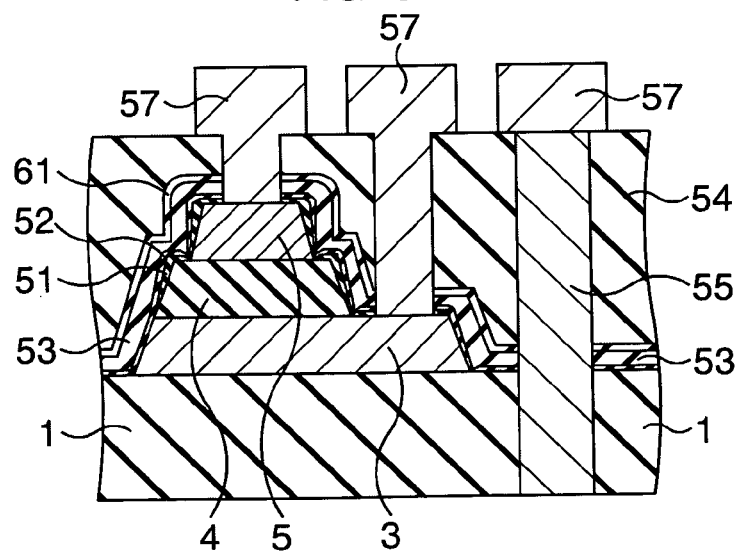

Next, as shown in FIG. 8I, in a state that a part of the upper electrode film 5, a part of the surface of the lower electrode 3, and the surface of the W-plug 55 are exposed, an Al film is formed. By patterning the Al film, an Al wiring 57 is formed. In this state, for example, the W-plug 55 and the upper electrode film 5 or the lower electrode film 3 are connected to each other by the Al wiring 57.

Furthermore, an interlayer insulating film, a contact plug, wirings under the second layer from the bottom and the like are formed. Then a cover film composing of, for example, a TEOS oxidized film and a Sin film is formed so as to complete the ferroelectric memory having the ferroelectric capacitor.

According to the third embodiment as described above, the $Al_2O_3$ film 61 is formed before the interlayer insulating film 54 is formed, so that the diffusion of hydrogen and/or moisture to the ferroelectric capacitor on forming the interlayer insulating film 54 is suppressed more efficiently. As the result, a high value related to a capacitor characteristic such as an imprint characteristic can be obtained.

Figure 9:
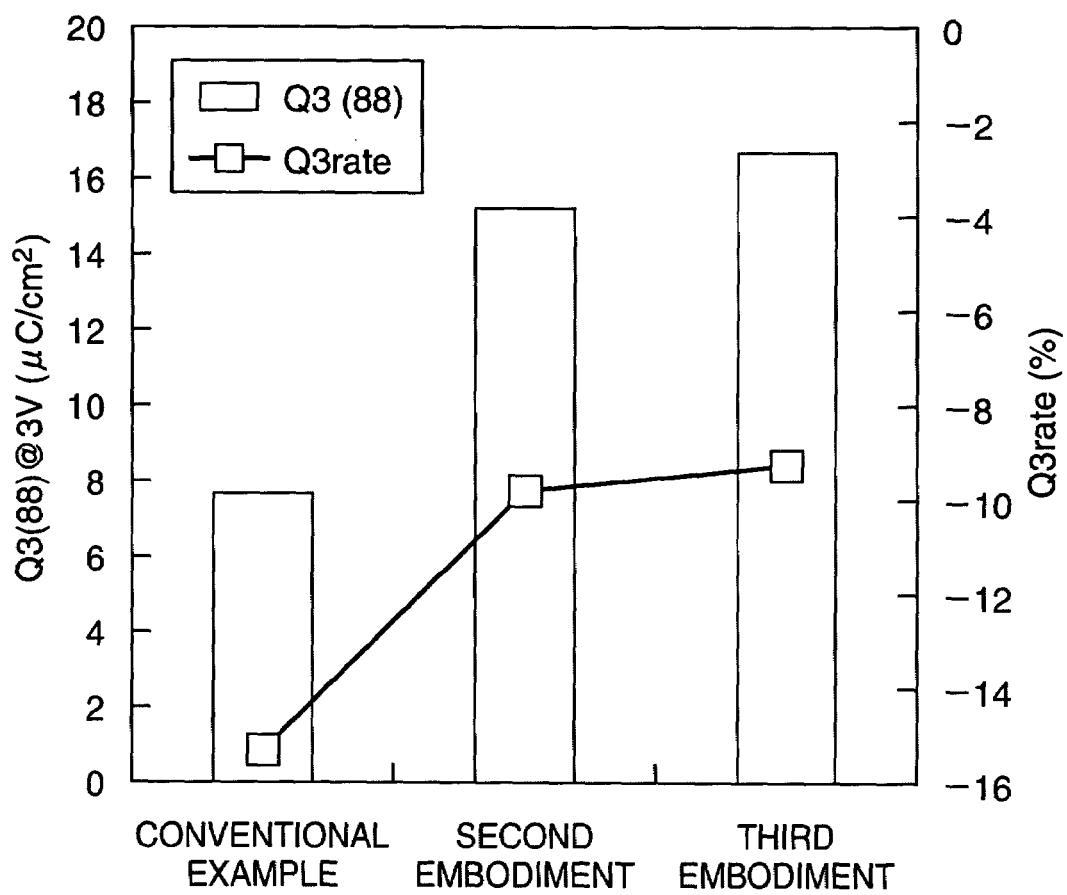
FIG. 9 is a graph showing imprint characteristics of the second and the third embodiments compared with an imprint characteristic of a prior art (conventional example)
Figure 10A:
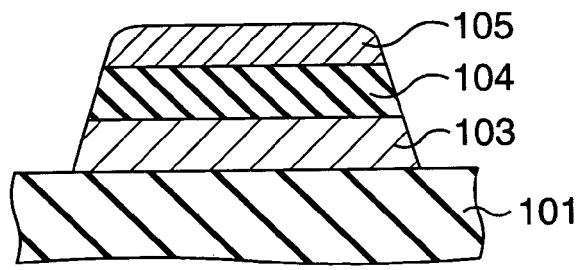
FIG. 10A to 10C are sectional views showing a first example (a first prior art) of a method for manufacturing a semiconductor device having a ferroelectric capacitor of a prior art in order of processes.
Figure 10B:
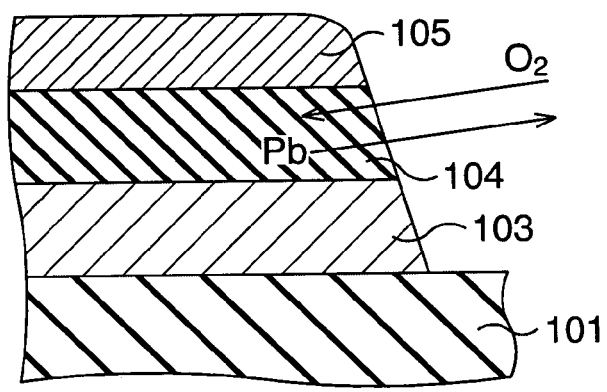
Figure 10C:
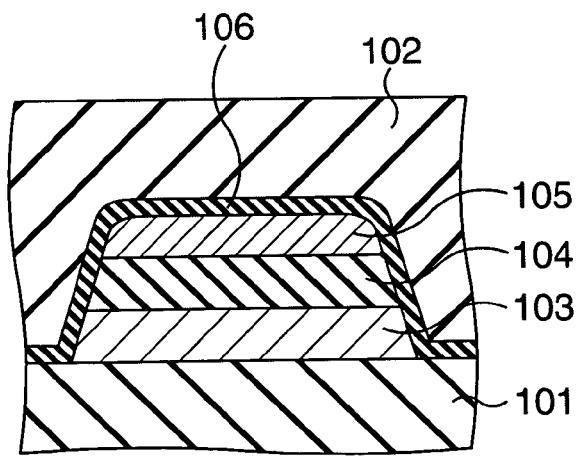
Figure 11A:
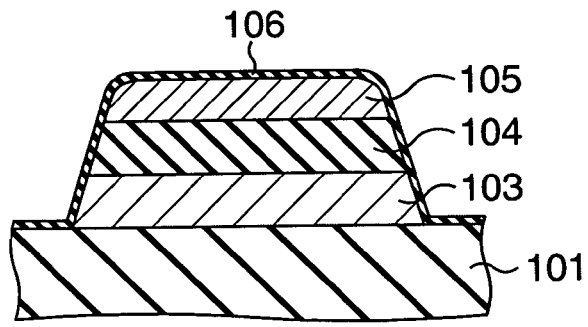
FIG. 11A to FIG. 11C are sectional views showing a second example (a second prior art) of a method for manufacturing a semiconductor device having a ferroelectric capacitor of a prior art in order of processes.
Figure 11B:
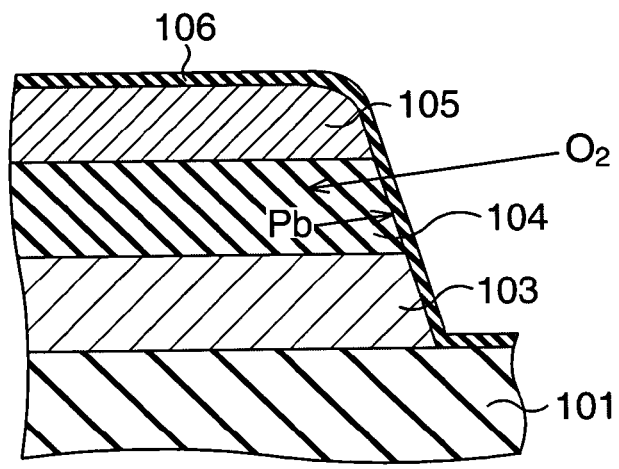
Figure 11C:
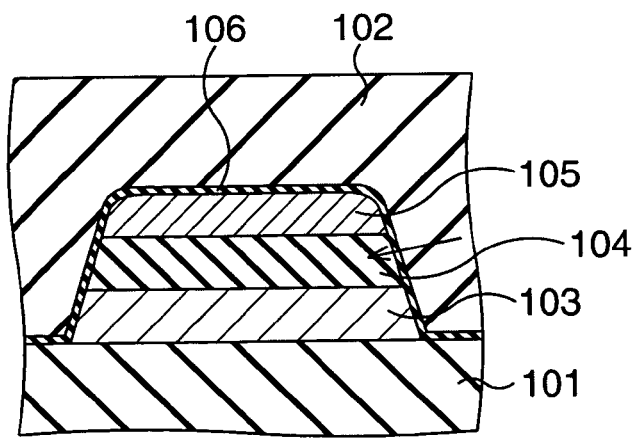
Figure 12A:
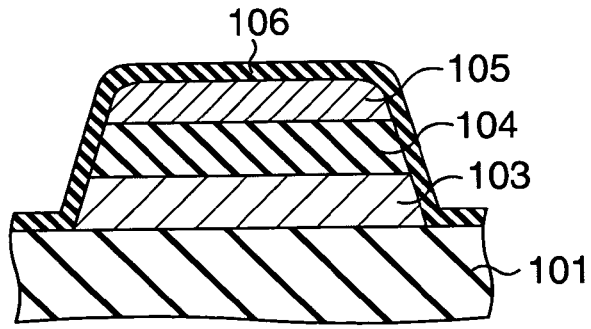
FIG. 12A to FIG. 12C are sectional views showing a third example (a third prior art) of a method for manufacturing a semiconductor device having a ferroelectric capacitor of a prior art in order of processes.
Figure 12B:
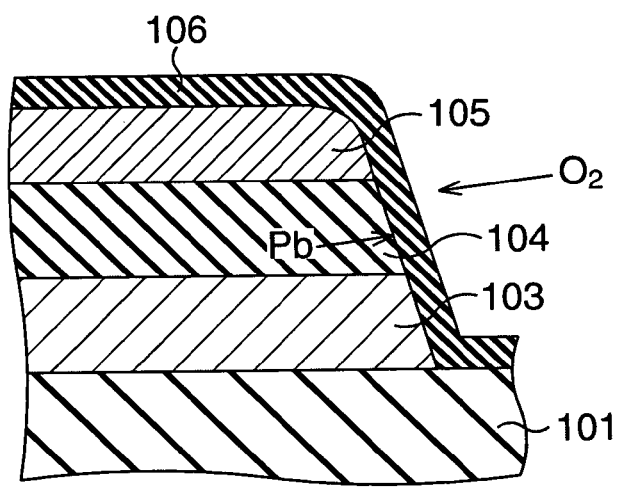
Figure 12C:
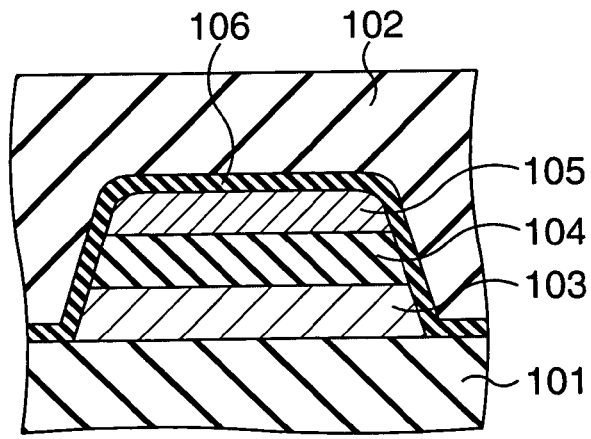
Figure 13A:
FIG. 13A to FIG. 13J are sectional views showing mainly parts related to a formation of an interlayer insulating film in a conventional method of manufacturing a semiconductor device having a ferroelectric capacitor of a prior art in order of processes.
Figure 13B:
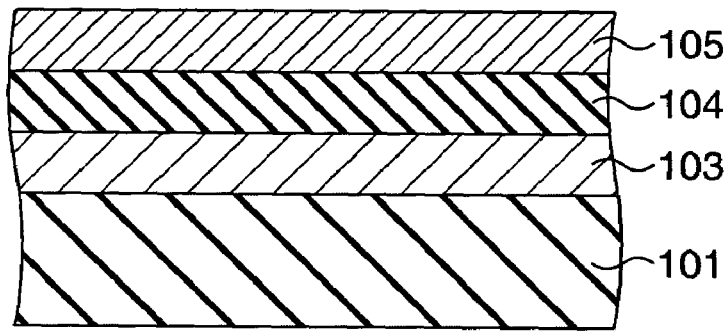
Figure 13C:
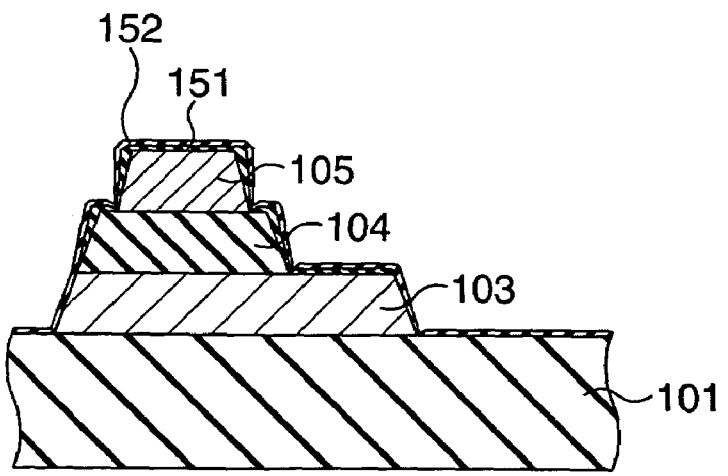
Figure 13D:
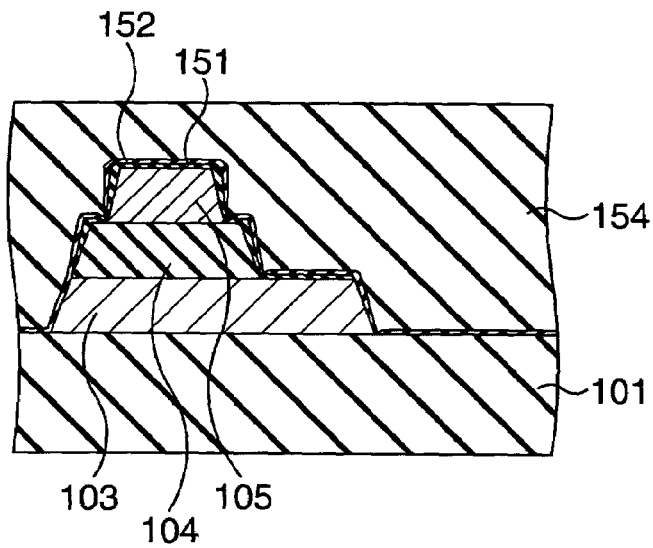
Figure 13E:
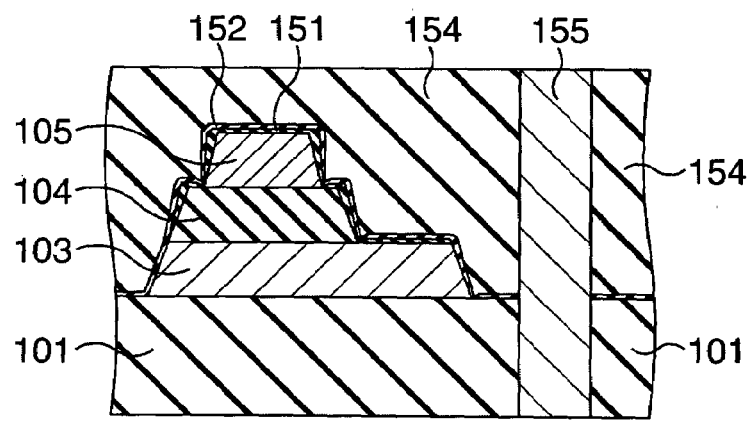
Figure 13F:
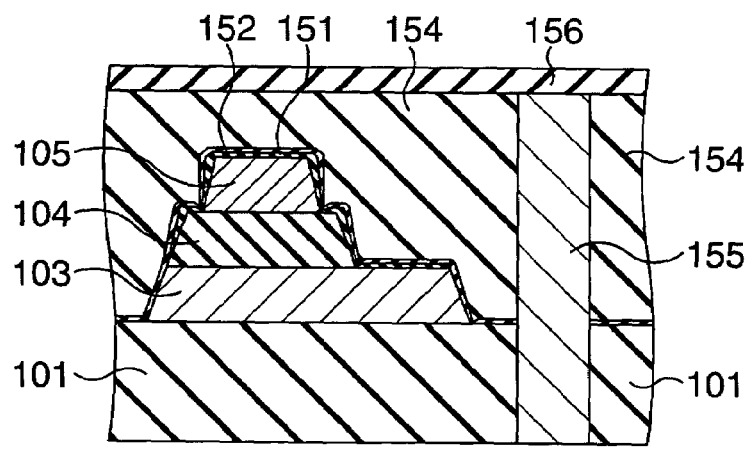
Figure 13G:
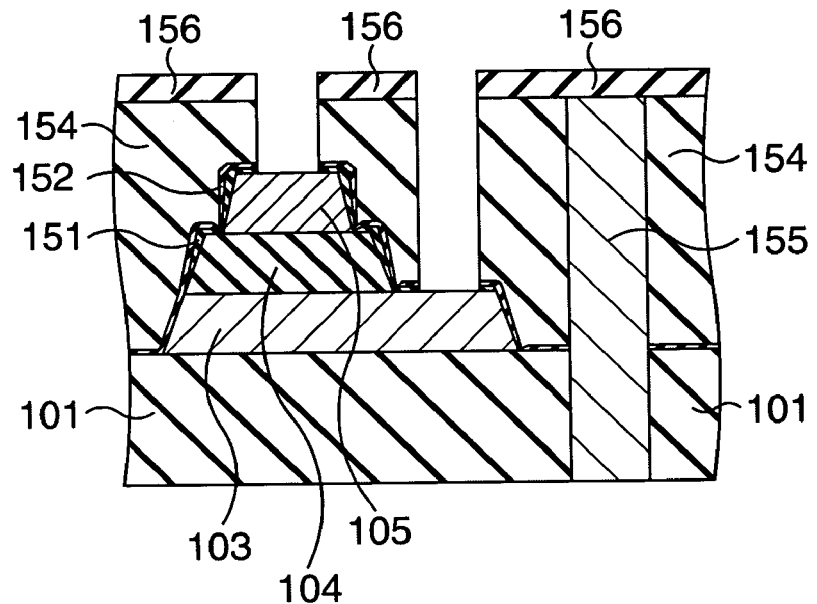
Figure 13H:
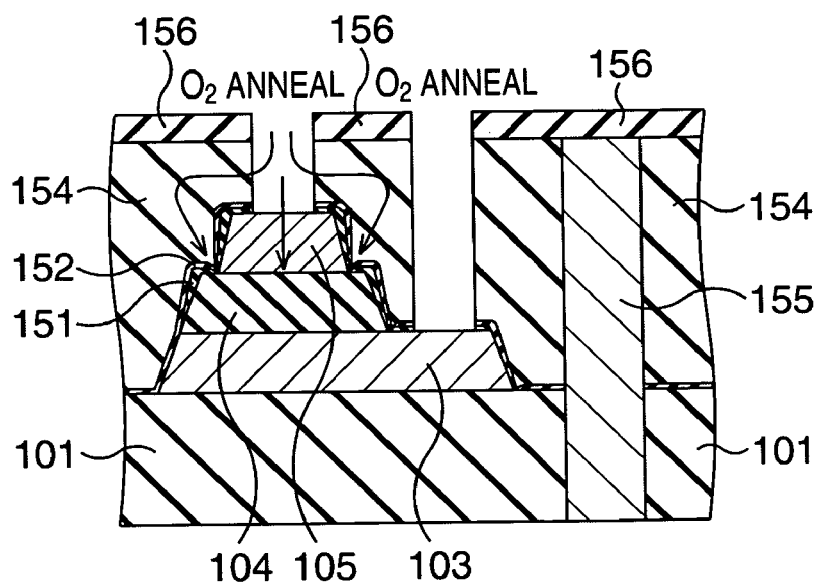
Figure 13I:
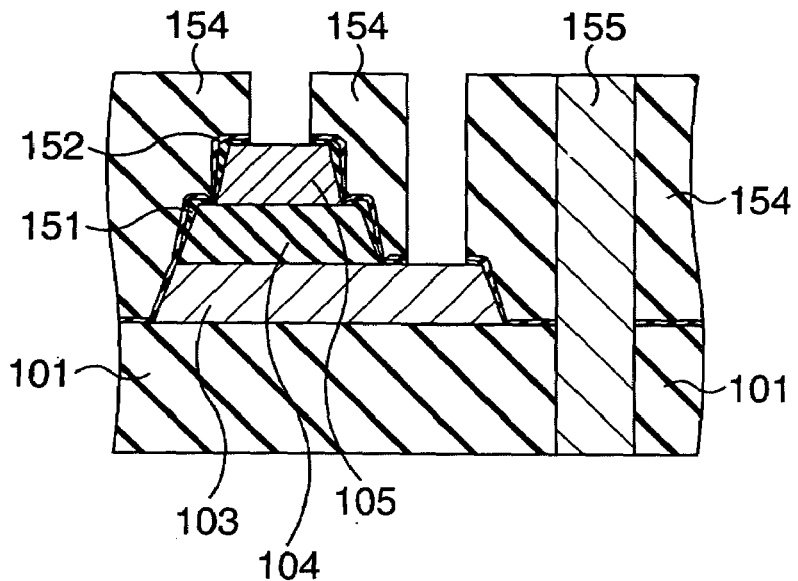
Figure 13J:
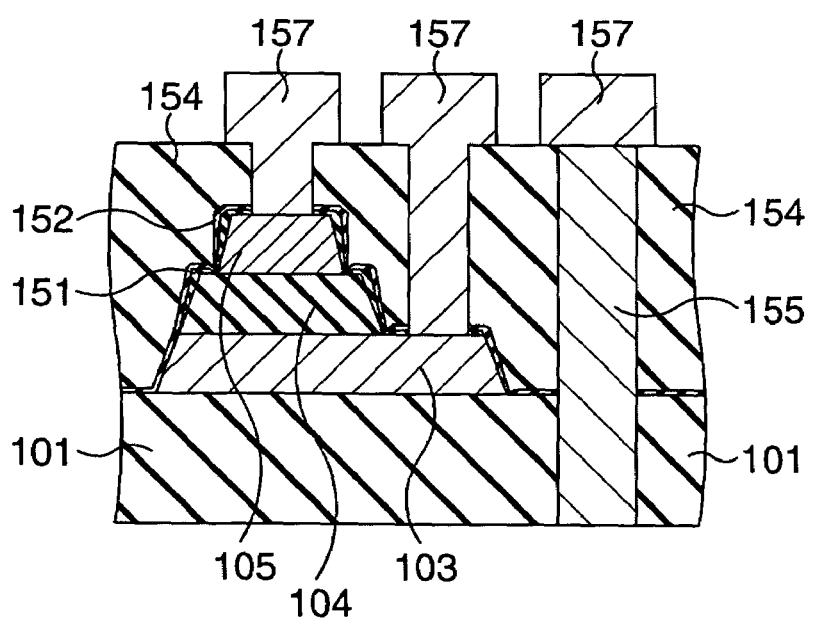

Hereinafter, a result of an experiment related to the imprint characteristic, according to the second and third embodiments, actually made by the present inventors will be explained. FIG. 9 is a graph showing imprint characteristics of the second and third embodiments compared with the imprint characteristic of prior art (conventional example). A vertical axis in left side of FIG. 9 [Q3(88)@3V: bar graph] shows a polarization amount at the time when 88 hours has passed since data was written in 3V. A vertical axis in right side of FIG. 9 (Q3 rate: sequential graph) shows the changes of the polarization amount till 88 hours passed after data was written in 3V. The polarization amount (left vertical axis) signifies that data becomes hard to be imprinted in the memory as the value grows high. The changes of polarization amount (right vertical axis) signifies that the imprint characteristic becomes hard to change as the value comes close to "0(Zero)", and the imprint characteristic deteriorates as the value becomes negative and the absolute value becomes high.

As shown in FIG. 9, according to the second and third embodiments, better imprint characteristics compared with the characteristic of prior art could be obtained. Besides, in the third embodiment, the $Al_2O_3$ film 61 is formed between the interlayer insulating film 53 and the interlayer insulating film 54, so that the deterioration of the PZT film 4 was suppressed more efficiently, a better result than the second embodiment could be obtained.

In the embodiments described above, a planar capacitor is fabricated, however, the present invention can be applied to a stack-type ferroelectric capacitor. In this case, a contact plug such as W-plug connected to a transistor like MOSFET may be connected to a lower electrode of the ferroelectric capacitor.

It should be noted that the first embodiment can be combined with the second embodiment, or third embodiment.

According to the present invention, damages given in the ferroelectric film during the manufacturing process can be made up for with high efficiency. Namely, in the first manufacturing method, since each thickness of the first and the second protective films is provided suitably, oxygen can be supplied sufficiently while suppressing unnecessary evaporation. Besides, in the second manufacturing method, by performing a suitable anneal regarding the formation of the interlayer insulating film which often gives damages to the ferroelectric film, the damage given on forming the interlayer insulating film can be recovered.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device, comprising the steps of:

forming a lower electrode film, a ferroelectric film and an upper electrode film;

patterning the upper electrode film, the ferroelectric film and the lower electrode film respectively;

forming a first protective film covering the upper electrode film, the ferroelectric film and the lower electrode film by an atomic layer deposition method which uses tetra-methyl-aluminum as a deposition gas and uses an oxidant not including hydrogen under a condition in which the ferroelectric film is not deteriorated;

supplying oxygen to the ferroelectric film via the first protective film by annealing in an atmosphere containing oxygen;

forming a second protective film covering the first protective film by an atomic layer deposition method which uses tetra-methyl-aluminum as a deposition gas and uses an oxidant not including hydrogen under a condition in which the ferroelectric film is not deteriorated;

forming a first interlayer insulating film above the second protective film;

after forming the first interlayer insulating film, supplying oxygen to the ferroelectric film via the first and second protective films by annealing in an atmosphere containing oxygen;

after supplying oxygen to the ferroelectric film via the first and second protective films, forming a second interlayer insulating film above the first interlayer insulating film; and forming a wiring connected to the upper electrode film, on the second interlayer insulating film;

wherein the first protective film has a thickness which is set to such a degree that configuration elements of the ferroelectric film do not substantially penetrate through the first protective film, and that oxygen penetrates through the first protective film;

wherein the second protective film has a thickness which is set to such a degree that hydrogen and moisture do not substantially penetrate through the second protective film; and wherein the first and second protective films are alumina films.

2. The method for manufacturing a semiconductor device according to claim 1,
wherein the ferroelectric film contains Pb.

3. The method for manufacturing a semiconductor device according to claim 1,
wherein the first and the second protective films are formed under a condition not deteriorating the ferroelectric film.

4. The method for manufacturing a semiconductor device according to claim 1,
wherein the first and second protective films are formed by a sputtering process.

5. The method for manufacturing a semiconductor device according to claim 1,
wherein the alumina film is formed by an Atomic Layer Deposition method using a deposit gas containing tri-methyl-aluminum and an oxidant not containing hydrogen.

6. The method for manufacturing a semiconductor device according to claim 1,
wherein the alumina film is formed by an plasma CVD method using a deposit gas containing aluminum tri-sec-butoxide or aluminum tri-isopropoxide and an oxidant containing oxygen.

7. The method for manufacturing a semiconductor device according to claim 1,
wherein the first protective film has a thickness of 10 nm to 100 nm.

8. The method for manufacturing a semiconductor device according to claim 1,
wherein the anneal in the atmosphere containing oxygen is performed at a temperature of 600° C. to 750° C.

9. The method for manufacturing a semiconductor device according to claim 1, comprising the step of:
forming a fourth protective film between the step of performing anneal in the atmosphere containing oxygen and the step of forming the second interlayer insulating film.

10. The method for manufacturing a semiconductor device according to claim 1, wherein the first interlayer insulating film has a thickness of 10 nm to 200 mm.

11. The method for manufacturing a semiconductor device according to claim 1, wherein the first and second interlayer insulating films are Si-type insulating films.

12. The method for manufacturing a semiconductor device according to claim 1, wherein the first and second interlayer insulating films are formed by a normal-pressure CVD method or a low-pressure CVD method using materials containing hydrogen.

13. A method for manufacturing a semiconductor device, comprising the steps of:
forming a lower electrode film, a ferroelectric films and an upper electrode film;
patterning the upper electrode film, the ferroelectric film and the lower electrode film respectively;
forming a third protective film for covering the upper electrode film, the ferroelectric film and the lower electrode film, such that the third protective film entirely covers the side and upper surface of the ferroelectric capacitor, wherein a thickness of a part of the third protective film at an outside of an interface between the upper electrode film and the ferroelectric film is thinner than at an outside of side surfaces of the upper electrode film and the ferroelectric film;
forming a first interlayer insulating film above the third protective film;
supplying oxygen to the ferroelectric film via the third protective film by annealing in an atmosphere containing oxygen; and
forming a second interlayer insulating film above the first interlayer insulating film.

14. The method for manufacturing a semiconductor device according to claim 13, comprising the step of:
forming a fourth protective film between the step of performing anneal in the atmosphere containing oxygen and the step of forming the second interlayer insulating film.

15. The method for manufacturing a semiconductor device according to claim 13, wherein the first interlayer insulating film has a thickness of 10 nm to 200 nm.

16. The method for manufacturing a semiconductor device according to claim 13, wherein the first and second interlayer insulating films are Si-type insulating films.

17. The method for manufacturing a semiconductor device according to claim 13, wherein the first and second interlayer insulating films are formed by a normal-pressure CVD method or a low-pressure CVD method using materials containing hydrogen.

18. The method for manufacturing a semiconductor device according to claim 13, comprising the step of:
supplying oxygen to the ferroelectric film via the third protective film by annealing at 350° C. or higher in an atmosphere containing oxygen, between the step of forming the third protective film 3 and the step of forming the first interlayer insulating film.

19. The method for manufacturing a semiconductor device according to claim 18, wherein the anneal at 350° C. or higher is performed not using plasma.

20. The method for manufacturing a semiconductor device according to claim 13, wherein the third protective film has a thickness of which side part of the upper electrode film is thinner than the thickness of upper part of the upper electrode film.

* * * * *